United States Patent
Drewery et al.

(10) Patent No.: US 6,719,886 B2
(45) Date of Patent: Apr. 13, 2004

(54) METHOD AND APPARATUS FOR IONIZED PHYSICAL VAPOR DEPOSITION

(75) Inventors: John Stephen Drewery, Alameda, CA (US); Glyn Reynolds, Gilbert, AZ (US); Derrek Andrew Russell, Scottsdale, AZ (US); Jozef Brcka, Gilbert, AZ (US); Mirko Vukovic, Gilbert, AZ (US); Michael James Grapperhaus, Gilbert, AZ (US); Frank Michael Cerio, Jr., Phoenix, AZ (US); Bruce David Gittleman, Scottsdale, AZ (US)

(73) Assignee: Tokyo Electron Limited, Tokyo (JP)

( * ) Notice: Subject to any disclaimer, the term of this patent is extended or adjusted under 35 U.S.C. 154(b) by 230 days.

(21) Appl. No.: 09/896,890

(22) Filed: Jun. 29, 2001

(65) Prior Publication Data

US 2002/0104751 A1 Aug. 8, 2002

Related U.S. Application Data

(63) Continuation of application No. PCT/US00/31756, filed on Nov. 17, 2000, which is a continuation-in-part of application No. 09/442,600, filed on Nov. 18, 1999, now Pat. No. 6,287,435.

(51) Int. Cl.$^7$ .............................................. C23C 14/35
(52) U.S. Cl. .......................... 204/298.18; 204/298.03; 204/298.06; 204/298.11; 204/298.12; 204/298.15; 204/298.19
(58) Field of Search ...................... 204/298.03, 298.06, 204/298.11, 298.12, 298.18, 298.19, 298.15

(56) References Cited

U.S. PATENT DOCUMENTS

| 4,431,901 A | 2/1984 | Hull | 219/121.52 |
|---|---|---|---|
| 4,657,654 A | 4/1987 | Mintz | 204/298.12 |
| 4,721,553 A | 1/1988 | Saito et al. | 204/192.12 |
| 4,795,879 A | 1/1989 | Hull et al. | 219/121.59 |
| 4,844,775 A | 7/1989 | Keeble | 216/68 |

(List continued on next page.)

FOREIGN PATENT DOCUMENTS

| EP | 0297779 | 1/1989 |
|---|---|---|
| EP | 0492992 | 7/1992 |
| EP | 0 593 924 A1 | 4/1994 |
| EP | 0607797 | 7/1994 |
| EP | 0 782 172 A2 | 7/1997 |

(List continued on next page.)

OTHER PUBLICATIONS

F. Cerio, et al., *Film Properties of Ti/TiN Bilayers Deposited Sequentially by Ionized PHysical Vapor Deposition*, J.Vac. Schi. Technol. A 16(3), May/Jun. 1998, pp. 1863–1867.

Primary Examiner—Rodney G. McDonald
(74) Attorney, Agent, or Firm—Wood, Herron & Evans, L.L.P.

(57) ABSTRACT

Ionized Physical Vapor Deposition (IPVD) is provided by a method of apparatus (500) particularly useful for sputtering conductive metal coating material from an annular magnetron sputtering target (10). The sputtered material is ionized in a processing space between the target (10) and a substrate (100) by generating a dense plasma in the space with energy coupled from a coil (39) located outside of the vacuum chamber (501) behind a dielectric window (33) in the chamber wall (502) at the center of the opening (421) in the sputtering target. A Faraday type shield (26) physically shields the window to prevent coating material from coating the window, while allowing the inductive coupling of energy from the coil into the processing space. The location of the coil in the plane of the target or behind the target allows the target-to-wafer spacing to be chosen to optimize film deposition rate and uniformity, and also provides for the advantages of a ring-shaped source without the problems associated with unwanted deposition in the opening at the target center.

28 Claims, 22 Drawing Sheets

U.S. PATENT DOCUMENTS

| | | | |
|---|---|---|---|
| 4,911,814 A | 3/1990 | Matsuoka et al. | 204/298.17 |
| 4,948,458 A | 8/1990 | Ogle | 438/729 |
| 4,990,229 A | 2/1991 | Campbell et al. | 204/298.06 |
| 5,069,770 A | 12/1991 | Glocker | 204/192.12 |
| 5,078,851 A * | 1/1992 | Nishihata et al. | 204/298.34 |
| 5,178,739 A | 1/1993 | Barnes et al. | 204/192.12 |
| 5,524,908 A | 6/1996 | Reis | 271/654 |
| 5,569,363 A | 10/1996 | Bayer et al. | 204/192.32 |
| 5,622,635 A | 4/1997 | Cuomo et al. | 216/68 |
| 5,653,812 A | 8/1997 | Petrmichl et al. | 118/723 E |
| 5,728,280 A | 3/1998 | Scherer | 204/298.18 |
| 5,763,851 A | 6/1998 | Forster et al. | 219/121.43 |
| 5,800,688 A | 9/1998 | Lantsman et al. | 204/298.11 |
| 6,051,122 A * | 4/2000 | Flanigan | 204/298.11 |
| 6,080,287 A * | 6/2000 | Drewery et al. | 204/192.15 |
| 6,197,165 B1 * | 3/2001 | Drewery et al. | 204/192.12 |
| 6,254,745 B1 * | 7/2001 | Vukovic | 204/298.06 |
| 6,287,435 B1 * | 9/2001 | Drewery et al. | 204/298.09 |
| 6,398,929 B1 * | 6/2002 | Chiang et al. | 204/298.11 |
| 6,446,572 B1 * | 9/2002 | Brcka | 118/723 ER |
| 6,523,493 B1 * | 2/2003 | Brcka | 118/723 I |

FOREIGN PATENT DOCUMENTS

| | | |
|---|---|---|
| EP | 0801413 | * 10/1997 |
| EP | 0827183 | 3/1998 |
| EP | 0 836 218 A2 | 4/1998 |
| EP | 0837489 | 4/1998 |
| EP | 0852392 | 7/1998 |
| EP | 0908922 | 4/1999 |
| EP | 0963146 | 12/1999 |
| JP | 61 190070 | 8/1986 |
| WO | WO9848444 | 10/1998 |
| WO | WO9901888 | 1/1999 |
| WO | WO9914791 | 3/1999 |
| WO | WO9934658 | 7/1999 |
| WO | 9957746 | * 11/1999 |
| WO | WO99/57746 | 11/1999 |

* cited by examiner

US 6,719,886 B2

METHOD AND APPARATUS FOR IONIZED PHYSICAL VAPOR DEPOSITION

This application is a continuation of PCT application no. PCT/US00/31756, filed Nov. 17, 2000, which is continuation in part to U.S. patent application Ser. No. 09/442,600 of John Drewery et al., filed Nov. 18, 1999 now U.S. Pat. No. 6,287,435, hereby expressly incorporated herein by reference.

FIELD OF THE INVENTION

This invention relates to the Ionized Physical Vapor Deposition (IPVD) and, more particularly, to methods and apparatus for depositing films, most particularly metal films, onto semiconductor wafer substrates by sputtering the coating material from a target, ionizing the sputtered material, and directing the ionized coating material onto the surface of the substrates.

BACKGROUND OF THE INVENTION

Ionized physical vapor deposition is a process which has particular utility in filling and lining high aspect ratio structures on silicon wafers. In IPVD, for deposition of thin coatings on semiconductor wafers, materials to be deposited are sputtered or otherwise vaporized from a source and then a substantial fraction of the vaporized material is converted to positive ions before reaching the wafer to be coated. This ionization is accomplished by a high-density plasma which is generated in a process gas in a vacuum chamber. The plasma may be generated by magnetically coupling RF energy through an RF powered excitation coil into the vacuum of the processing chamber. The plasma so generated is concentrated in a region between the source and the wafer. Then electromagnetic forces are applied to the positive ions of coating material, such as by applying a negative bias on the wafer. Such a negative bias may either arise with the wafer electrically isolated, by reason of the immersion of the wafer in a plasma, or by the application of an RF voltage to the wafer. The bias causes ions of coating material to be accelerated toward the wafer so that an increased fraction of the coating material deposits onto the wafer at angles approximately normal to the wafer. This allows deposition of metal over wafer topography including in deep and narrow holes and trenches on the wafer surface, providing good coverage of the bottom and sidewalls of such topography.

Certain systems proposed by the assignee of the present application are disclosed in U.S. patent applications Ser. Nos. 08/844,751; 08/837,551 and 08/844,756 filed Apr. 21, 1997, hereby expressly incorporated herein by reference. Such systems include a vacuum chamber which is typically cylindrical in shape and provided with part of its curved outer wall formed of a dielectric material or window. A helical electrically conducting coil is disposed outside the dielectric window and around and concentric with the chamber, with the axial extent of the coil being a significant part of the axial extent of the dielectric wall. In operation, the coil is energized from a supply of RF power through a suitable matching system. The dielectric window allows the energy from the coil to be coupled into the chamber while isolating the coil from direct contact with the plasma. The window is protected from metal coating material deposition by an arrangement of shields, typically formed of metal, which are capable of passing RF magnetic fields into the interior region of the chamber, while preventing deposition of metal onto the dielectric window that would tend to form conducting paths for circulating currents generated by these magnetic fields. Such currents are undesirable because they lead to ohmic heating and to reduction of the magnetic coupling of plasma excitation energy from the coils to the plasma. The purpose of this excitation energy is to generate high-density plasma in the interior region of the chamber. A reduction of coupling causes plasma densities to be reduced and process results to deteriorate.

In such IPVD systems, material is, for example, sputtered from a target, which is charged negatively with respect to the plasma, usually by means of a DC power supply. The target is often of a planar magnetron design incorporating a magnetic circuit or other magnet structure which confines a plasma over the target for sputtering the target. The material arrives at a wafer supported on a wafer support or table to which RF bias is typically applied by means of an RF power supply and matching network.

A somewhat different geometry employs a plasma generated by a coil placed internal to the vacuum chamber. Such a system does not require dielectric chamber walls nor special shields to protect the dielectric walls. Such a system is described by Barnes et al. in U.S. Pat. No. 5,178,739, expressly incorporated by reference herein. Systems with coils outside of the chamber, as well as the system disclosed in the Barnes et al. patent, involve the use of inductive coils or other coupling elements, either inside or external to the vacuum, that are physically positioned and occupy space between the planes of the sputtering target and the wafer.

Whether a coupling element such as a coil is provided inside or outside of a vacuum chamber, dimensions of the system have been constrained by the need for adequate source-to-substrate separation to allow for the installation of the RF energy coupling elements between the source and the substrate. Adequate diameter must also be available around the wafer for installation of coils or other coupling elements. As a direct result of the increased source-to-substrate spacing due to the need to allow space for the coupling element, it is difficult to achieve adequate uniformity of deposition with such systems. If the height of the chamber is reduced to improve uniformity, there is a loss of plasma density in the central region of the chamber and the percentage of ionization of the coating material is reduced. Also, in practice, the entire system must fit within a constrained radius. As a result, there are frequently problems due to heating arising from the proximity of the RF coils to metal surfaces, which may necessitate extra cooling, which increases engineering and production costs and wastes power.

An IPVD apparatus with the coil in the chamber has the additional disadvantage that the coils are eroded by the plasma and must, therefore, consist of target grade material of the same type as that being sputtered from the target. Moreover, considerable cooling of coils placed in the vacuum chamber is needed. If liquid is used for this cooling of the coils, there is danger that the coils will be penetrated, by uneven erosion or by arcing, causing a resulting leak of liquid into the system, which is highly undesirable and will likely result in a long period of cleaning and re-qualification of the system. Furthermore, an excitation coil in the chamber also couples capacitively to the plasma, leading to inefficient use of the excitation power and to the broadening of the ion energy spectrum, which may have undesirable effects on the process.

The miniaturization of semiconductor devices has resulted in a need to form low resistance connections to contacts at the bottoms of high aspect ratio holes of a fraction of a micron in diameter. This has increased the demand for the use of highly electrically conductive metals, such as copper, over barrier layers of materials, such as tantalum and tantalum nitride. The techniques for depositing such materials in the prior art have not been totally satisfactory.

The deposition of materials by PVD methods has, in the prior art, involved critical designs of sputtering sources to produce plasma concentrations of uniform geometries within sputtering chambers and to directly affect the distribution uniformities of the deposited films. The prior art approaches have resulted in compromises of other performance parameters to those ends.

As a result of the above considerations and problems, there remains a need for more efficiently coupling energy into the dense coating material ionizing plasma in IPVD processing systems, and to do so without interfering with the optimum dimensions of the chamber and preferably without placing a coil or other coupling element into the vacuum chamber.

SUMMARY OF THE INVENTION

One objective of the present invention is to provide an IPVD method and an IPVD apparatus in which the placement of the coil or other coupling element does not adversely affect the geometry of the chamber of the processing apparatus. Another objective of the present invention is to provide a more efficient and effective method and apparatus for the performance of IPVD.

According to the principles of the present invention, an IPVD apparatus is provided with a ring-shaped source of coating material for producing a vapor that includes atoms or minute particles of the coating material to a processing space within a vacuum chamber. At the center of the ring-shaped source is provided a coupling element for reactively coupling RF energy into the chamber to produce a high-density, reactively coupled plasma in the processing space to ionize coating material passing through the processing space. The ions of coating material drift, whether under the influence of electrostatic or electromagnetic fields or otherwise, toward a substrate in the chamber, at the opposite end of the processing space from the source. Those ions that arrive within a certain distance, for example, in the order of a centimeter, from the substrate, encounter a sheath field and are accelerated toward the substrate so that a high percentage of the coating material arrives on the substrate at angles normal to the substrate, thereby more effectively lining the bottoms and sides of, or filling, small and high aspect ratio features on the surface of the substrate.

In one embodiment of the invention, a coating material source, preferably a sputtering target, is provided with a central opening in which is placed a dielectric window. Behind the window, outside the vacuum of the chamber, is located a plasma source which includes a coupling element, preferably a coil, which is connected to the output of an RF energy source. The coupling element is configured to couple, preferably inductively, energy supplied from the energy source through the window at the opening at the center of the material source and into the region of the chamber between the coating material source and the substrate, such as a semiconductor wafer, on a substrate support at the opposite end of the chamber from the coating material source.

The apparatus of the present invention includes an annular sputtering target which surrounds a central ceramic window. This annular target is preferably frusto conical in shape. A magnetron magnet assembly is positioned behind the target to produce a plasma confining magnetic field over the target, preferably in the shape of an annular tunnel on the surface of the annular target surrounding the central opening at its center.

The coupling element is preferably a coil positioned behind and close to the back outside surface of the dielectric window at the central opening of an annular sputtering target. RF energy of, for example, 13.56 MHZ, is applied to the coil to excite a high-density inductively coupled plasma in the chamber between the target and the substrate. A main sputtering plasma that is trapped under the field of the magnetron magnets at the surface of the target, sputters coating material from the target and into the region of the processing space occupied by the dense secondary plasma, where a substantial portion of the material is stripped of electrons to form positive ions of the coating material. A negative bias voltage is applied to a wafer on the substrate holder, which attracts the positive ions of sputtering material from the region of the secondary plasma and toward and onto the surface of the substrate, with the angles of incidence approaching being perpendicular to the substrate so that they can enter trenches and holes on the wafer substrate to coat the bottoms of these holes and trenches.

Certain embodiments of the apparatus and method of the invention include an IPVD source that employs a three-dimensional coil that energizes a dense inductively coupled three-dimensional plasma in three-dimensional regions within the chamber. The chamber is operated at a vacuum pressure of between 30 and 130 mTorr to essentially thermalize the plasma, so that ions of coating material can be formed in the plasma and electrically directed perpendicular to and onto the substrate, thereby reducing the effect of target and magnet configuration on coating uniformity. The IPVD source is coupled through a window into the chamber through a high dielectric material such as a TEFLON spacer and then through a dielectric window such as quartz which forms the vacuum barrier closing a circular opening in the chamber wall at the center of an annular target. Inside the chamber is a window shield having chevron-shaped slots therein oriented relative to the conductors of the coil. The shield protects the window from deposits, particularly deposits of metallic coating material, while passing inductively coupled RF energy into the chamber. The shield may further function as a Faraday shield, preventing capacitive coupling from the coil to the plasma and avoiding flux compression heating. The shield has integral cooling and is formed of cast copper which is plated with aluminum, so that the shield can be reconditioned by chemically dissolving aluminum coating to remove buildup and then re-plating the copper shield with aluminum for reuse. The window and shield assembly form a removeable combination. The window and shield are spaced so the window is self cleaning adjacent the slits in the shield by plasma that forms at this point in the slits.

The target is preferably frusto conical, with the walls of the truncated cone inclined about 35° to the horizontal or plane of the window. A permanent magnet pack is employed which produces three, and preferably only three, magnetic tunnels over the target surface, with a main central tunnel dominating early in the target life to erode the mean radius of the annular target and two side tunnels taking over later in the life of the target to erode grooves adjacent the inner and outer rims of the target annulus.

The apparatus preferably uses a wafer holder mounted for vertical motion on a Z-table motion drive to provide for target-to-substrate spacing (TSS) of from six to nine inches and to provide for wafer handoff to a transfer arm from a transfer module. The support is provided with an electrostatic chuck, and wafer heating and cooling is provided using a Peltier device remote from the support that connects through a GALDEN fluid loop with the support and through another fluid loop with a heat sink. The electrostatic chuck is tri-polar with the chuck grid serving as electrodes to provide 2-zone bias to the wafer to attract the ionized sputtered material to the wafer. A shadow ring is provided around the edge of the wafer to provide non-contact edge masking.

The chamber has a removable shield insert in two parts that mechanically float relative to each other to accommodate different expansions due to different heating. The shield assembly is a replaceable subcombination. The apparatus is particularly useful for depositing copper over tantalum and tantalum nitride and for depositing the underlying tantalum and tantalum nitride barrier layer over a patterned wafer, with Ta deposited by ionized PVD and TaN deposited by PVD in the same chamber, followed by deposition of copper by ionized PVD in a similar module attached to a transfer module of the same tool. The copper so deposited is suitable to be followed by any of many methods of Cu fill, particularly by electroplating. The processes are preferably carried out using process parameters, including: pressures, temperatures, gases, bias power and/or voltage levels, sputtering power levels, IC power levels, etc., as described below.

With apparatus structure according to the invention, the processing chamber can be dimensioned to provide optimum spacing between the coating material source and the substrate to provide both good ionization of sputtered species as well as good uniformity of deposition on the wafers.

The present invention provides greater freedom of design choice in configuring the processing chamber to optimize the IPVD process, and does so while overcoming the difficulties set forth in the background above.

These and other objectives and advantages of the present invention will be more readily apparent from the following detailed description of the drawings.

DETAILED DESCRIPTION OF THE INVENTION

Figure 1:
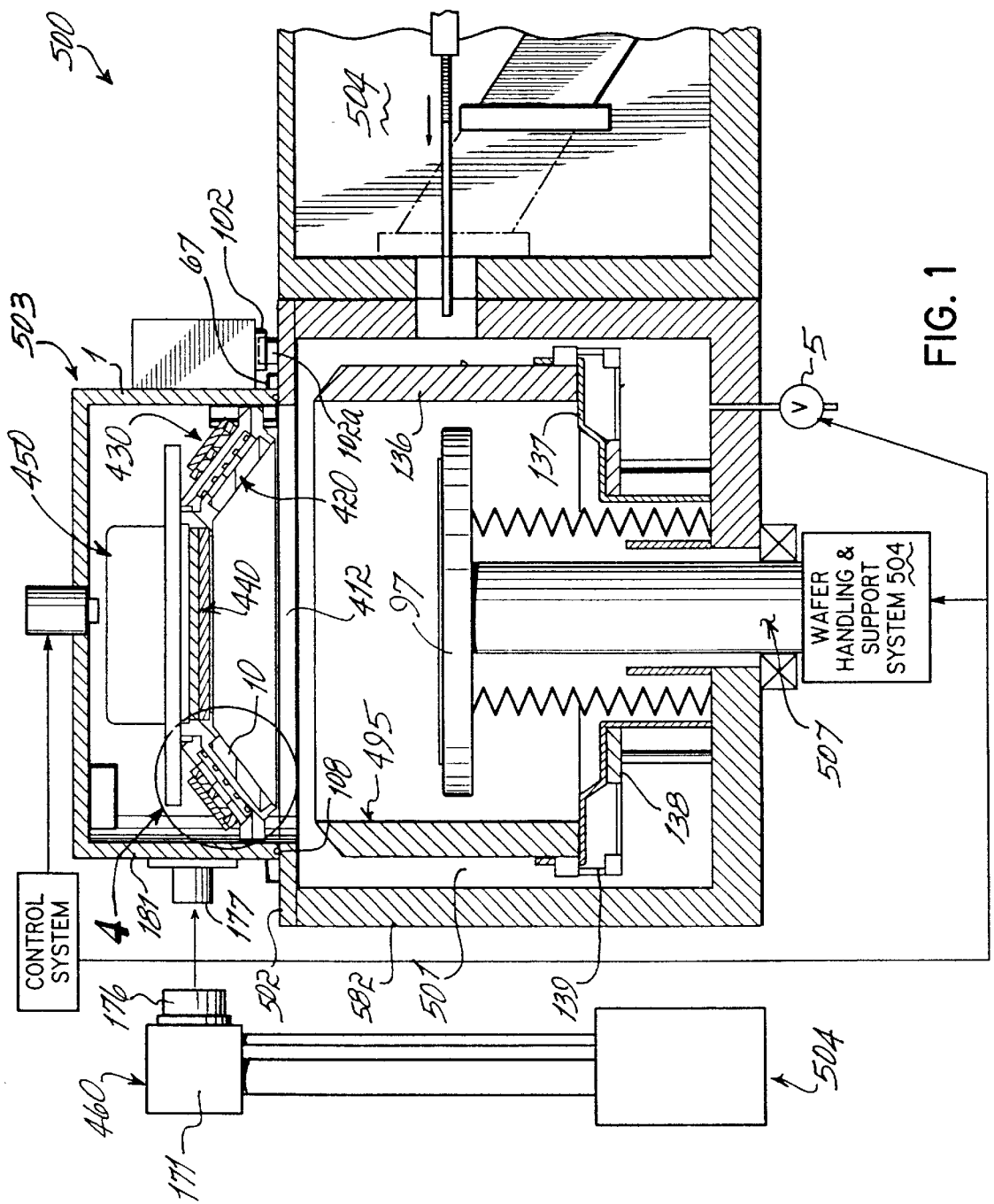
FIG. 1 is a schematic cross-sectional diagram of one embodiment of IPVD apparatus according to the present invention.

An Ionized Physical Vapor Deposition (IPVD) apparatus 500 according to one embodiment of the present invention is illustrated in FIG. 1. The IPVD apparatus 500 includes a vacuum chamber 501 bounded by a chamber wall assembly 502. The chamber 501 is provided with an IPVD source 503 supplying coating material in vapor form into the volume of the sputtering chamber 501 and for ionizing the sputtering material vapor; an electrostatic chuck wafer support system 507 for holding wafers during processing; a wafer handling system 504,504a for loading and unloading wafers for processing; a vacuum and gas handling system 505 (FIGS. 20–21) for evacuation of the chamber 501 to a vacuum pressure level; an IPVD source hoist 460 for removal and replacement of the target and for performing other servicing of the source; and a control system 509 which operates the other systems of the apparatus 500 in accordance with the methods and processes described herein and otherwise carried out with the apparatus 500.

The apparatus 500 is a serviceable module capable of providing features and operating conditions including the following: (1) base vacuum of less than $10^{-8}$ Torr, (2) operating inert gas pressure of between 30 and 130 mTorr, (3) provision for reactive gas at partial pressure of 0–50 mTorr, (4) variable substrate-to-target spacing of 6 to 9 inches, (5) electrostatic chucking with backside gas heating or cooling, and (6) shielding that restricts deposition to removable, cleanable components with surfaces having good adhesion of sputtered material to prevent particle generation.

The general concepts of the IPVD source 503 are described in U.S. patent application Ser. No. 09/073,141, hereby expressly incorporated herein by reference. The particular implementation of the source 503 includes a ring-shaped target 10 of a type laid out in that application, particularly one of a frusto-conical shape. Essentially, the principle objectives of the IPVD source 503 include providing the following features and properties: (1) to require minimum operator effort and smallest possible set of tools to perform routine tasks, (2) to provide separation of RF and DC power from any water or other cooling fluid to the best extent possible, (3) to provide relative simplicity of design and operation, (4) to allow rapid repair or replacement of the source including quick replacement of the whole internal source assembly, rapid change of the target and of the various chamber shields, (5) to provide modular internal assemblies, and (6) to maintain RF shielding integrity to prevent leakage of radiation into the operating environment.

Figure 1A:
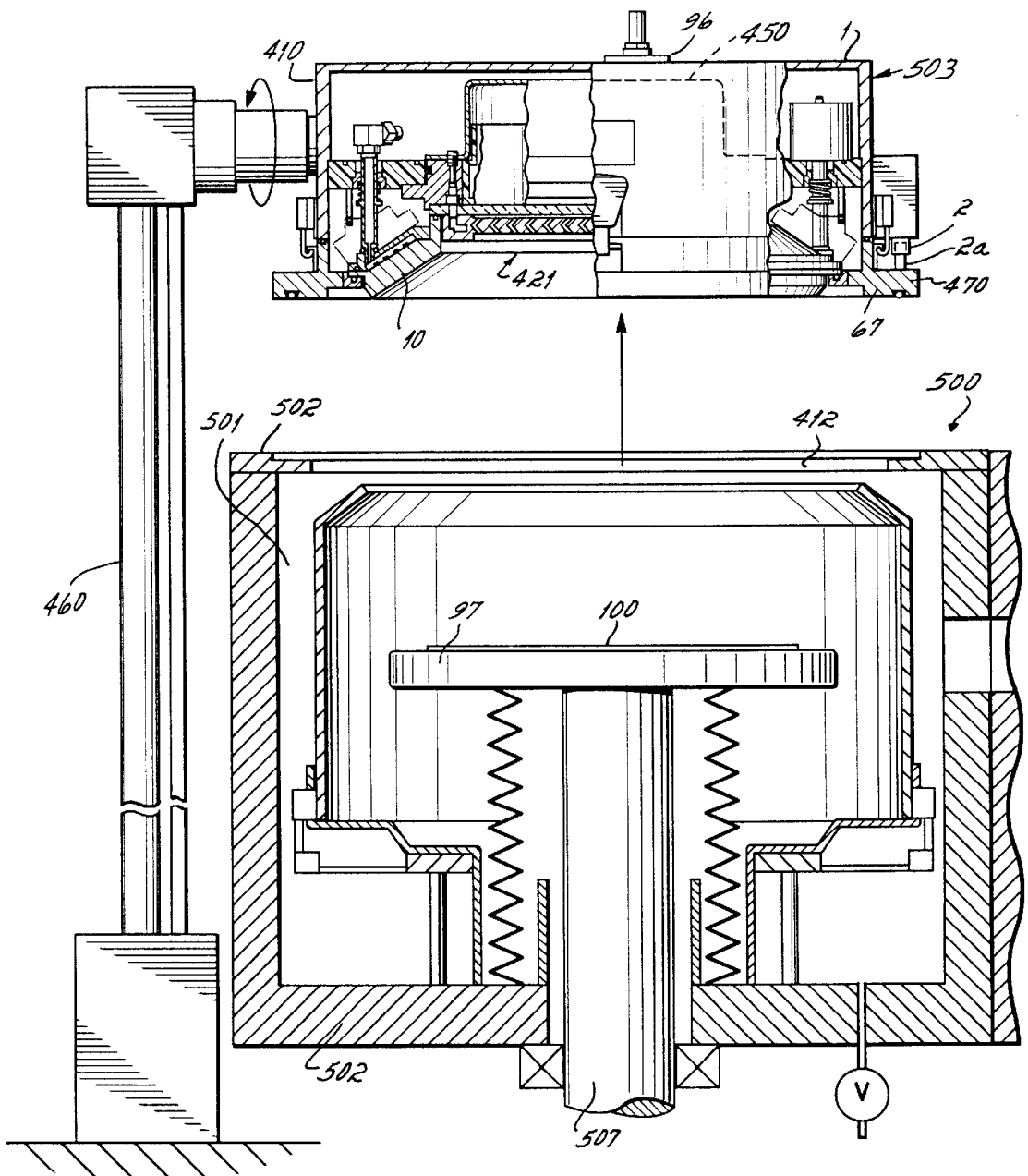
FIG. 1A is a cross-sectional diagram similar to FIG. 1, illustrating the apparatus with the IPVD source being removed.
Figure 1B:
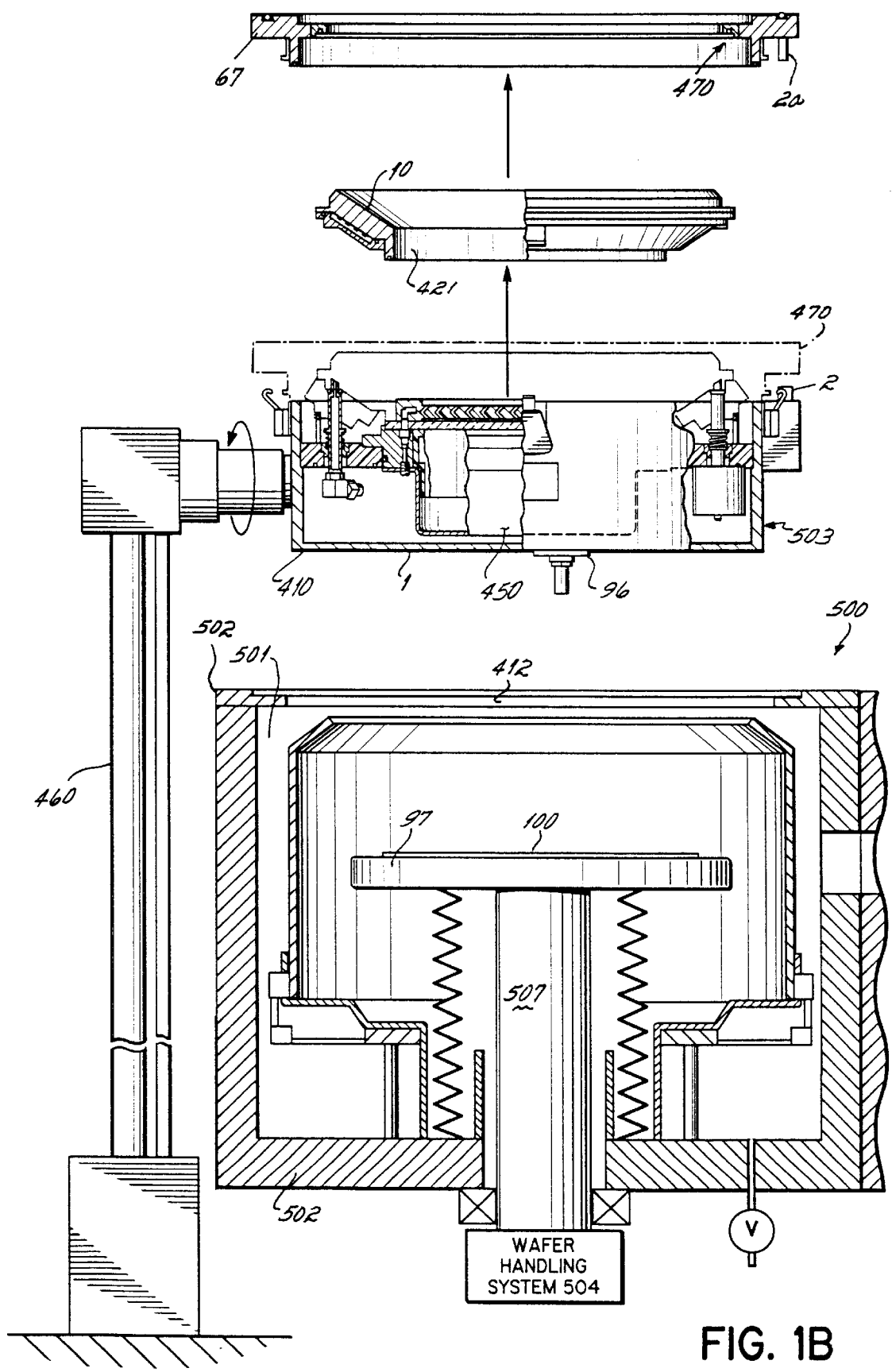
FIG. 1B is a diagram, similar to FIG. 1A, illustrating the IPVD source of the apparatus with the source flange and target assembly being removed.
Figure 1C:
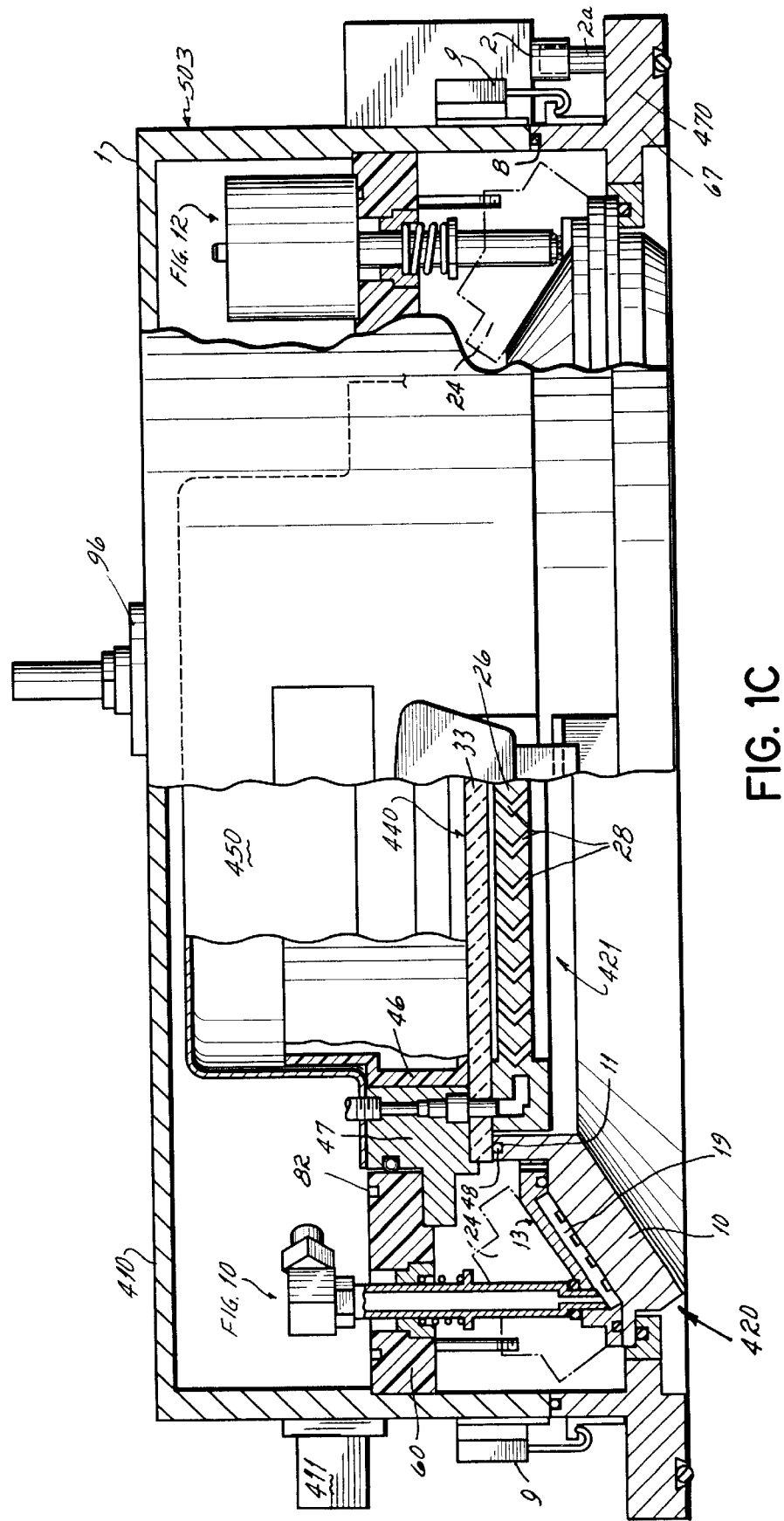
FIG. 1C is a partial cross-sectional diagram of the IPVD source of the apparatus of FIG. 1, the line along which the cross section is taken being illustrated in FIG. 13, described below.
Figure 1D:
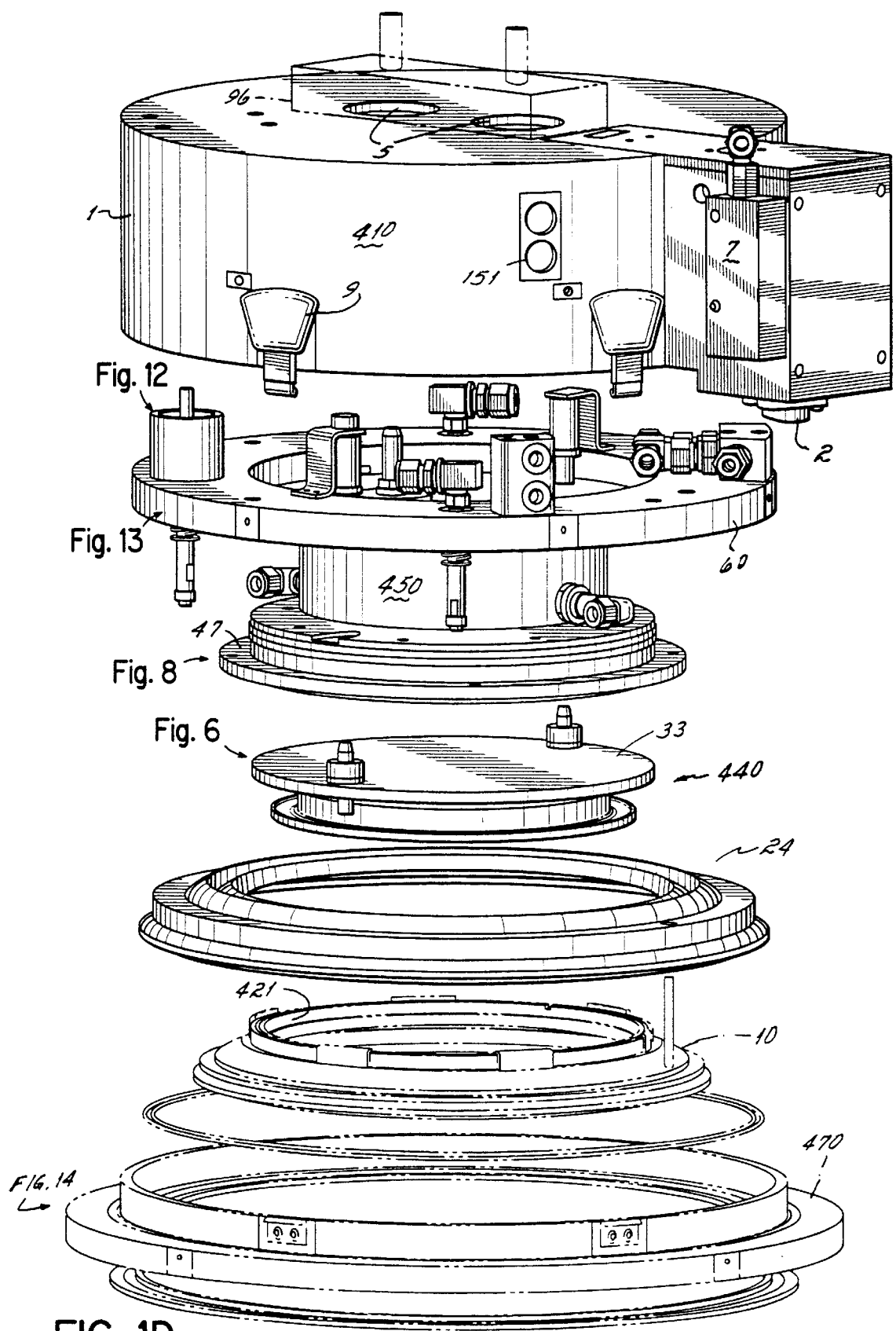
FIG. 1D is a disassembled perspective view of the IPVD source of FIG. 1C.

The IPVD source 503 rests upon the top of the wall 502 and is provided with a source flange and dark space ring assembly 470 that forms a vacuum tight seal with the wall 502 around the perimeter of a circular opening 412 in the top of the chamber wall 502. The IPVD source includes the annular target 10 and an RF source assembly 450, which energizes an inductively coupled plasma in the chamber 501. The RF source assembly is situated in an opening 421 inside of the annulus of the target 10, opposite a wafer, for example, a 200 mm or 300 mm wafer, 100 which is to be mounted on an electrostatic chuck 97 of the wafer support system 507. The source 503 includes a source housing assembly 410 that includes a source housing 1 (FIG. 2), which is preferably an aluminum weldment. The source housing 1 includes structure for mounting the working parts of the source 503, and coupling structure 411 for rendering the source 503 capable of being engaged, lifted, and lowered by the source hoist assembly 460 for installation on, and removal from, the apparatus 500, as illustrated in FIG. 1A. Once lifted by the source hoist 460, the IPVD source 503 can be rotated and thus inverted by the hoist 460 from its operative, downwardly facing orientation (FIGS. 1 and 1A) to the upwardly facing orientation of FIG. 1B in which the source 503 can be serviced, for example, to replace the target 10 or to remove other components of the source 503 for cleaning or servicing.

Figure 2:
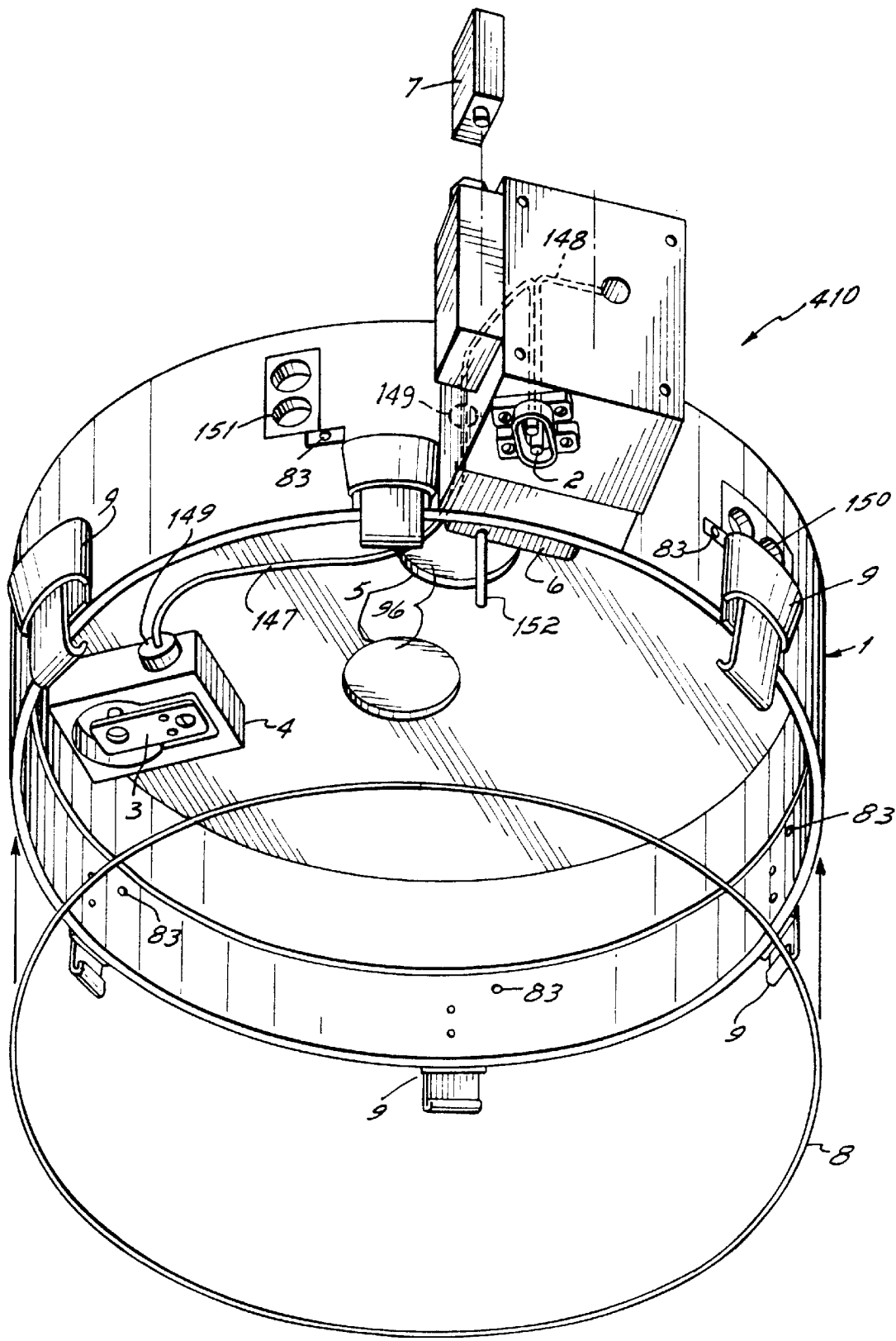
FIG. 2 is a disassembled perspective view of the housing portion of the IPVD source of FIGS. 1C and 1D.

As illustrated in FIG. 2, the IPVD source 503 is the source of the coating material and the ionization energy for producing the ionized coating material for deposition by the IPVD apparatus 500. Target sputtering power is brought into the housing 1 via a connector 2. For depositing metal or other electrically conductive coating material, the target sputtering power is DC power supplied by a DC power supply (not shown) on the apparatus 500. Where non-conductive material is to be deposited, the target power is provided by an RF power supply. The power connector 2 mates to a connector 2a permanently mounted on the chamber wall 502 when the source 503 is installed in its operating position on the top of the chamber 501. As a result, target power cannot appear on the target 10 without the source 503 in place on the chamber 501. A negative DC feed 147 passes through watertight strain relieving bushings 149 to a socket 3 mounted in an insulating block 4 inside the housing 1 while a positive feed 148 is connected directly to the housing 1, which is typically maintained at the system ground potential.

Figure 7:
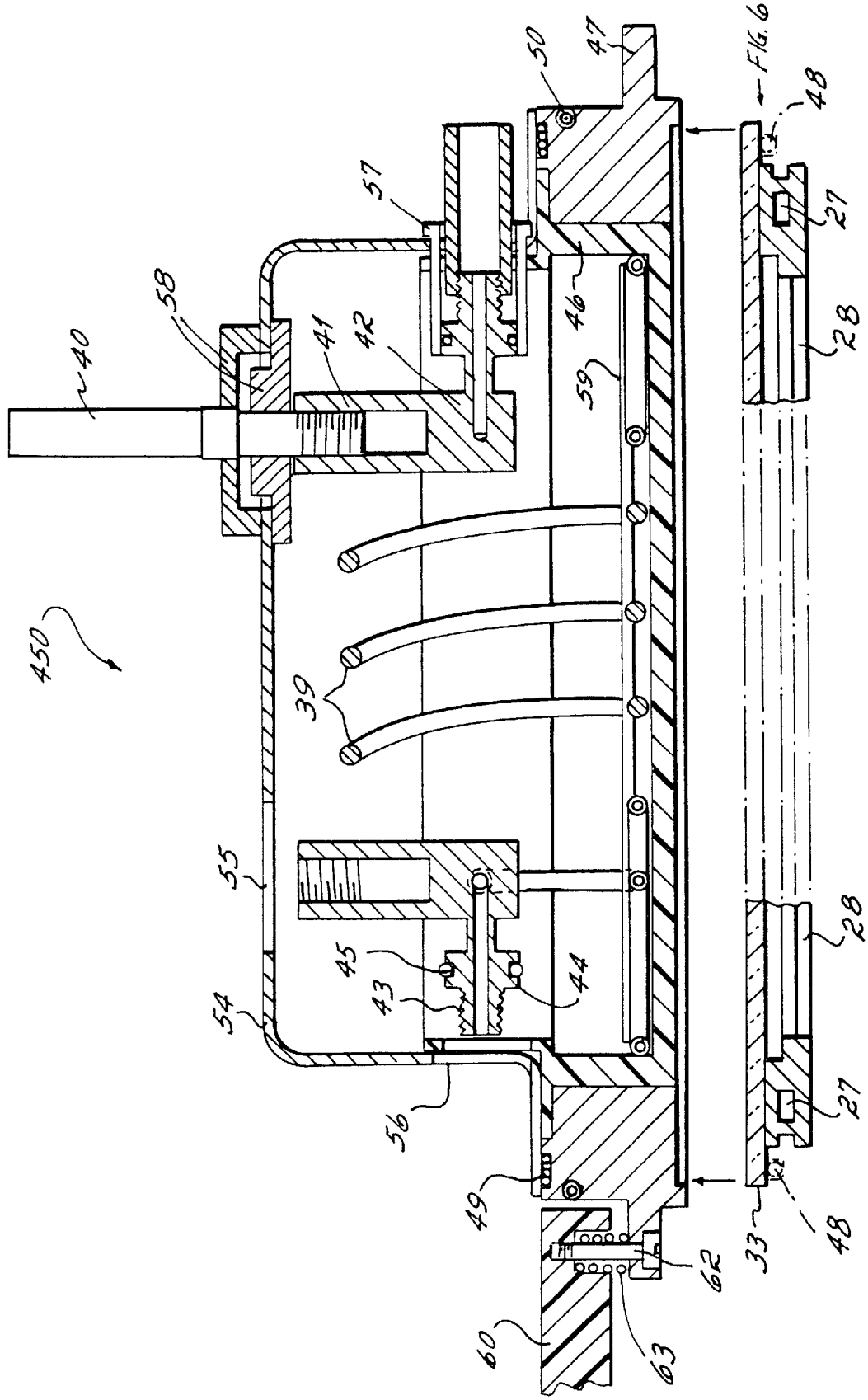
FIG. 7 is cross-sectional view of the RF source assembly of the IPVD source of FIGS. 1C and 1D.
Figure 8:
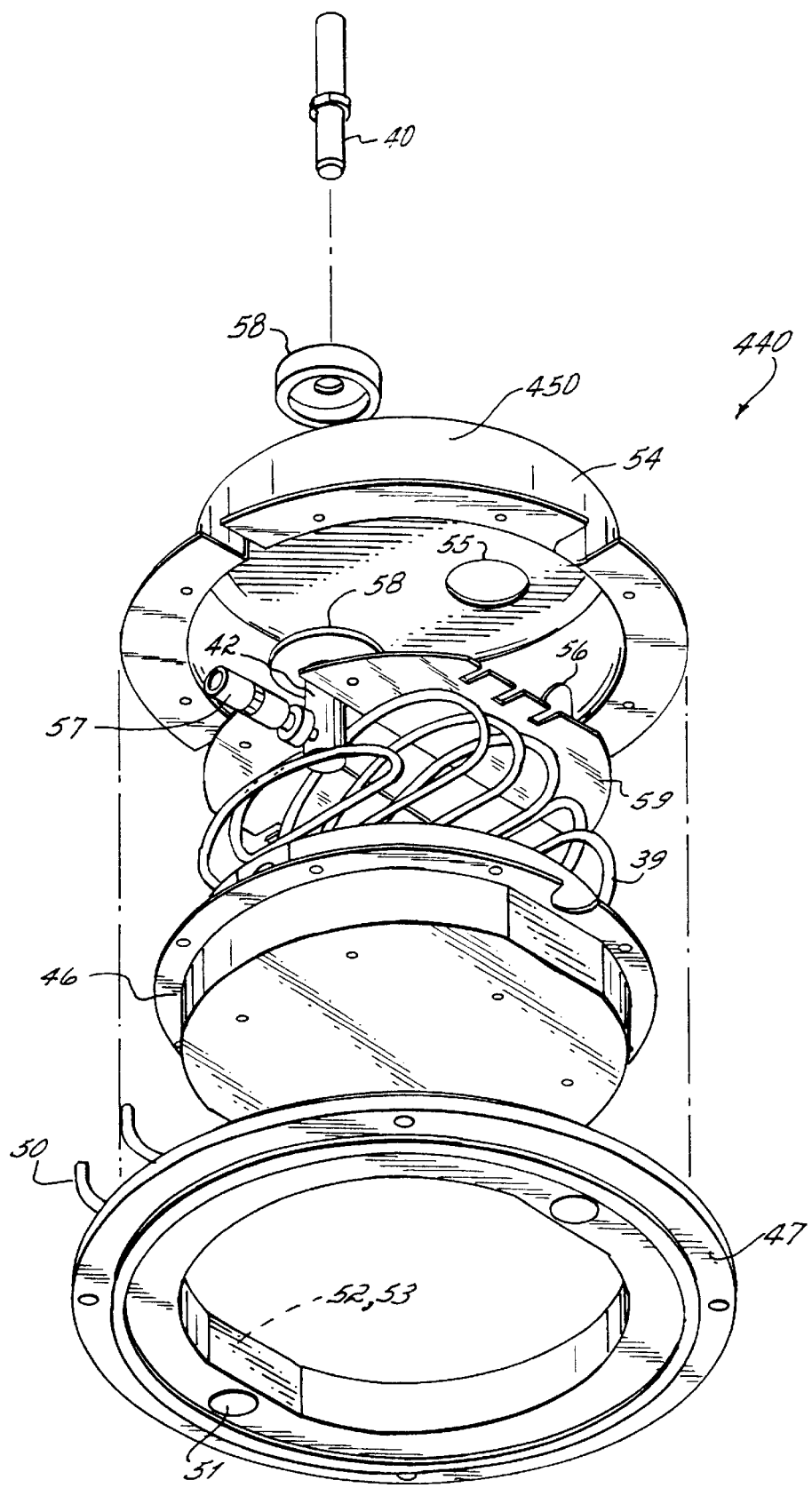
FIG. 8 is a disassembled perspective view of the RF source assembly of FIG. 7.

Ports 5 are provided in the top of the housing 1 through which pass conductors 40 (FIG. 7) for RF connections 152 to an RF tuner 96 (FIG. 2) of an inductively coupled plasma (ICP) generator (FIGS. 6–8) on top of the source housing 1. The autotuner 96 is a commercial unit that mounts to the top of the source housing 1 (FIG. 2). Large female connectors 40a supply power to the RF coil assembly 450 via connectors 40 (FIGS. 7–8). Outside of the housing 1, RF cables connect the RF tuner 96 to an RF generator (not shown) on the apparatus 500. The housing 1 is also provided with an interlock switch 6 that detects the presence of the RF tuner unit 96 and the coil assembly 450.

Figure 13:
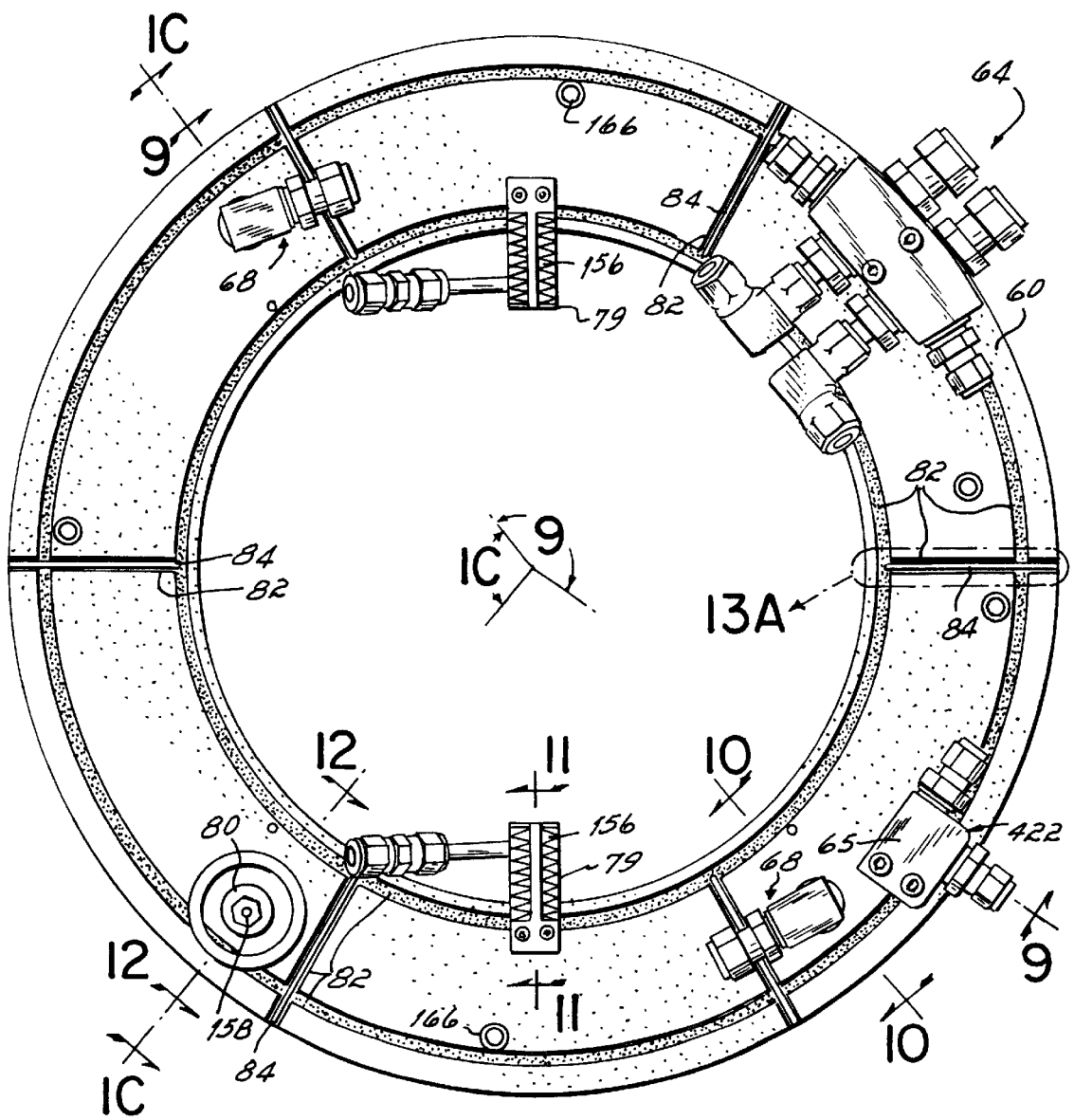
FIG. 13 is a top view of the magnet and cooling manifold mounting assembly portion of the IPVD source assembly of FIGS. 1C and 1D.

An interlock switch 7 is provided that is actuated by a pushrod mechanism 7a, which is activated by a spring loaded pin 166 (FIGS. 9 and 13) to activate the switch 7 when the target 10 is properly installed. The interlock 7 is provided to ensure that water and power cannot be supplied unless the target 10 is in place and locked down. A canted coil spring 8 is provided that makes an electrical connection to a source flange and dark space ring assembly 470 surrounding a circular opening 412 in the top of the wall 502 of the chamber 501. A plurality of, for example, three to six, hand-operated clips 9 are provided at equally spaced intervals around the housing 1, which, when released, allow the source flange and dark space ring assembly 470 to be removed and the target 10 to be changed or otherwise serviced, or to permit removal and replacement of the target 10 or the servicing of other components within the source housing 1. Ports 150 are provided for water inlet and outlet, and ports 151 are provided for a connection to a water loop external to the main source housing 1.

Figure 3:
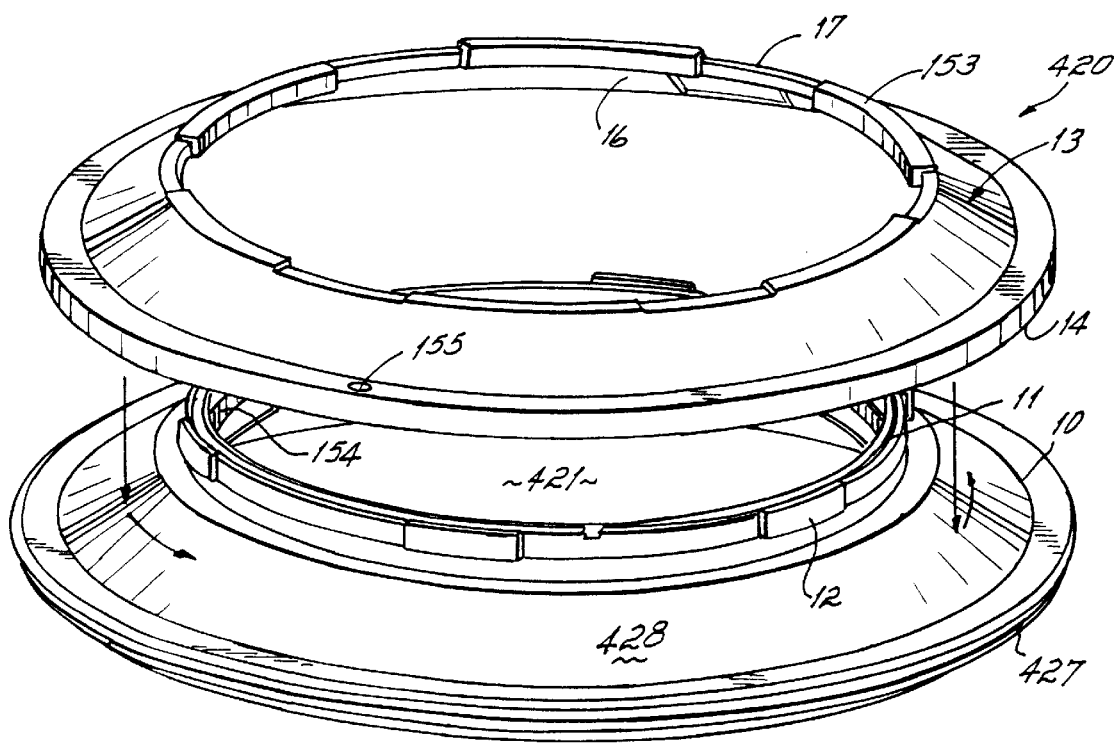
FIG. 3 is a disassembled perspective view of the target assembly portion of the IPVD source of FIGS. 1C and 1D.

The target 10 is part of a target assembly 420, which is illustrated in FIG. 3. The target 10 is frusto conical, and is designed to minimize manufacturing costs. It has a single upper O-ring groove 11 defining the upper vacuum coupling and a well-finished surface 427 which makes the lower coupling. The rear 428 of the target 10 is smooth. The target 10 may be monolithic as is usually the case when the target 10 is copper, or it may be formed by bonding a layer of source material to a structural backing plate by one of a number of techniques well known to sputtering engineers. The opposite sides of the target define an included angle of divergence of a cone which is preferably about 110°.

The 110° included angle of the conical target 10 was selected after extensive computer modeling, using the HPEM code of Kushner et al. This angle leads to optimum uniformity of deposition at the pressures, powers, and target-substrate spacings of, preferably, about six to nine inches. A smaller included angle might also be desirable, but angles lower than 90 degrees are expected to lead to a reduction in deposition rate without much uniformity improvement. Higher included angles are expected to give poorer target utilization and poorer deposition uniformity.

An O-ring groove 11 is provided at the upper extreme of the target 10 at the inner edge of the target annulus around central opening 421 of the target 10. Castellated features 12 are provided to the outside of the O-ring groove 11 to allow the target 10 to assemble to a cooling water system 422 (FIG. 9) without the use of screws. A step 154 is provided in the inside diameter around the opening 421, which, in combination with a similar step in the window shield and window assembly 440 (FIG. 6), described below, prevents deposition of metal on a dielectric window 33 that covers the opening 421 also as described below.

The target 10 mates with a cooling cover 13 to define the cooling water system 422. This cover 13 has 'quad ring' water seals 14 and 15 on its inside on each side of a channel 16. These seals 14, 15 contact the rear of the target 10 when the target 10 and cover 13 are assembled. Bayonet assembly structure 153 is provided which mates with the castellated features 12 on the target 10 to connect the cover 13 to the target 10. To join the target 10 and cover 13, slots 17 are provided in the cover 13 to allow the cover 13 to be dropped over the castellated features 12, after which the target 10 and cover 13 are rotated with respect to each other to produce a 'jam jar' effect that tightens the parts 10,13 together as they are rotated through about 20°, which is somewhat less than half of the angular spacing between the castellated features 12 and the matching bayonet assembly structure 153.

Figure 3A:
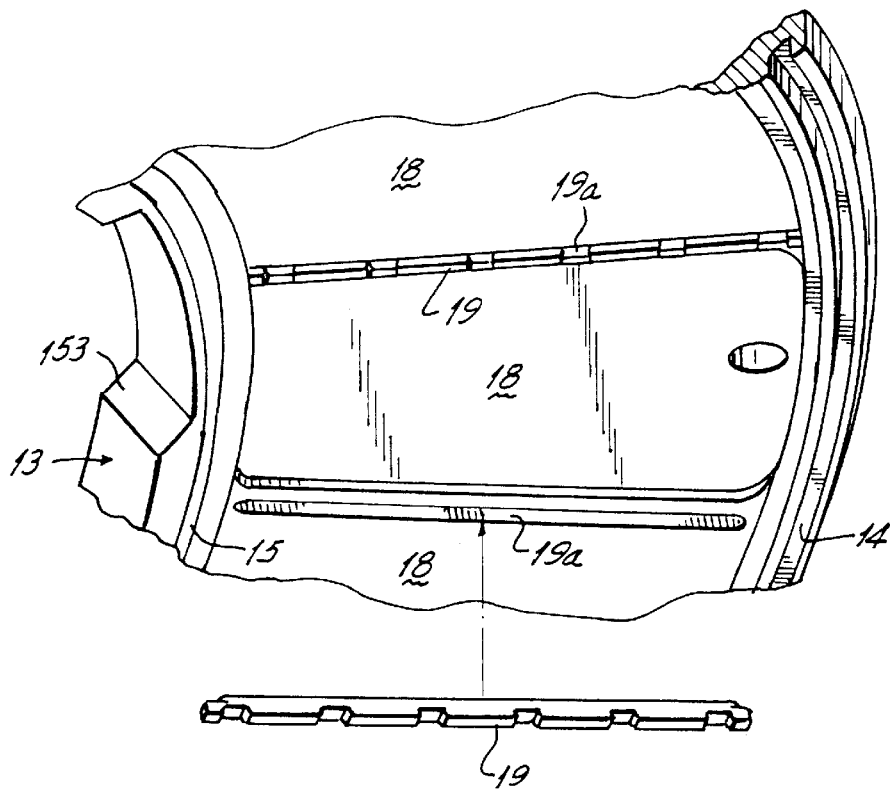
FIG. 3A is a fragmentary perspective view of a portion of the cover of the target assembly of FIG. 3.

Water for target cooling enters and exits the cooling cover 13 via ports 155 into manifolds 18 formed in a ring-shaped channel 16 in the front surface of the cover 13, as illustrated in FIG. 3A. These ports 155 and manifolds 18 are located 180° from each other around the channel 16 in the cover 13. The manifolds 18 are deeper than the channel 16 and each occupy about a 10° sector of the channel 16. On each side of each manifold 18 is a groove 19a that accepts a comb 19. Each comb 19 is a thin metal insert that bears a series of notches 19b. These notches 19b divide water into separate streams as it enters the main channel 16, avoiding the formation of stagnation regions in the water flow which could lead to a reduction of cooling efficiency or possible local boiling of the water. The design of the combs 19 is determined by computational flow dynamics modeling. The combs 19 may be removed and replaced with others designed for different flow rates versus pressure relationships without removal and replacement of the entire cover 13. At the end of target life, the cover 13 may be removed from the expired target and reused. Water coupling is made through the cover 13 into the manifolds 18 via spring loaded water couplings 69 (FIGS. 9–10) which are described below. DC power is connected via a spring loaded stub 80 (FIG. 12), described below.

Figure 4:
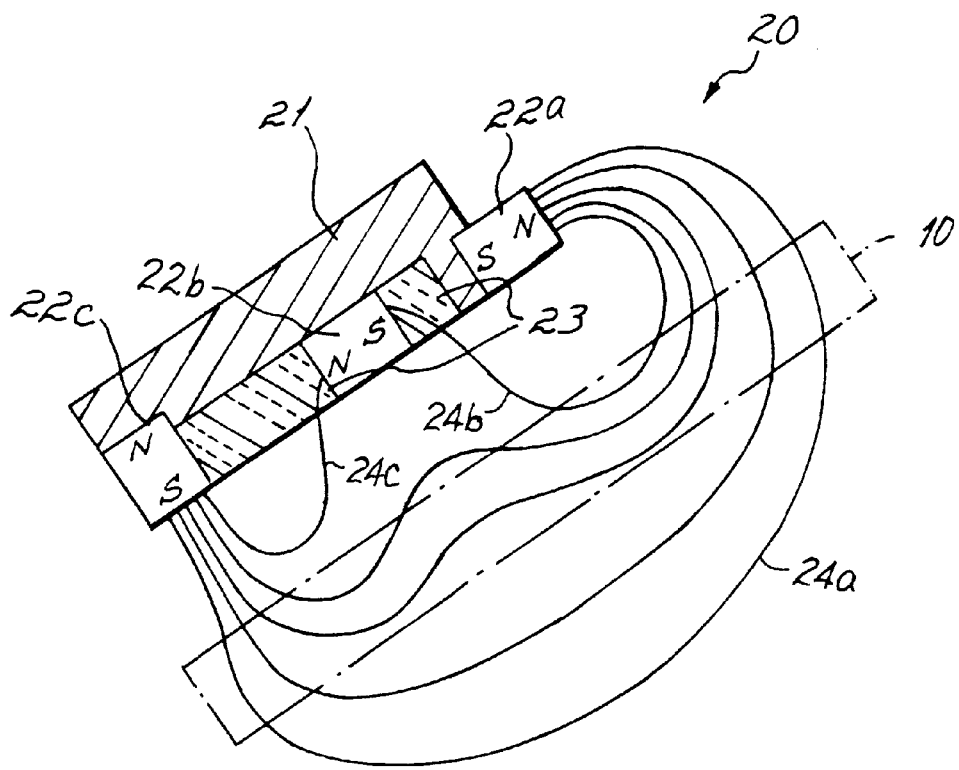
FIG. 4 is an enlarged schematic cross-sectional view of the magnetron magnet assembly of the IPVD source of FIGS. 1C and 1D.

The IPVD source 503 includes a magnetron magnet assembly 430, illustrated in FIG. 4, which includes a magnet pack 20 that connects to the back of the target assembly 420. The magnet pack 20 includes a steel yoke 21 and a series of magnets 22 arranged in three rings including an inner ring 22a, an intermediate ring 22b and an outer ring 22c, as shown. The resulting field lines produced by the magnets 22 include a main magnetic tunnel 26, which affects the target erosion at the beginning of a target life and runs in a circular path along an intermediate radius of the annular target 10, and inner and outer magnetic tunnels 27 and 28, respectively, which distribute the target erosion toward the inner and outer rims of the target annulus toward the end of the target life. The erosion groove due to this arrangement thereby broadens as the target erodes leading to enhanced target material utilization. The magnets 22 are held in their locations by adhesive bonding. Non-magnetic rings 23 may be used to space the magnets correctly, and the assembly may be encased in a molded plastic material body 24 having a convenient shape for mounting to the source housing 1.

Figure 5:
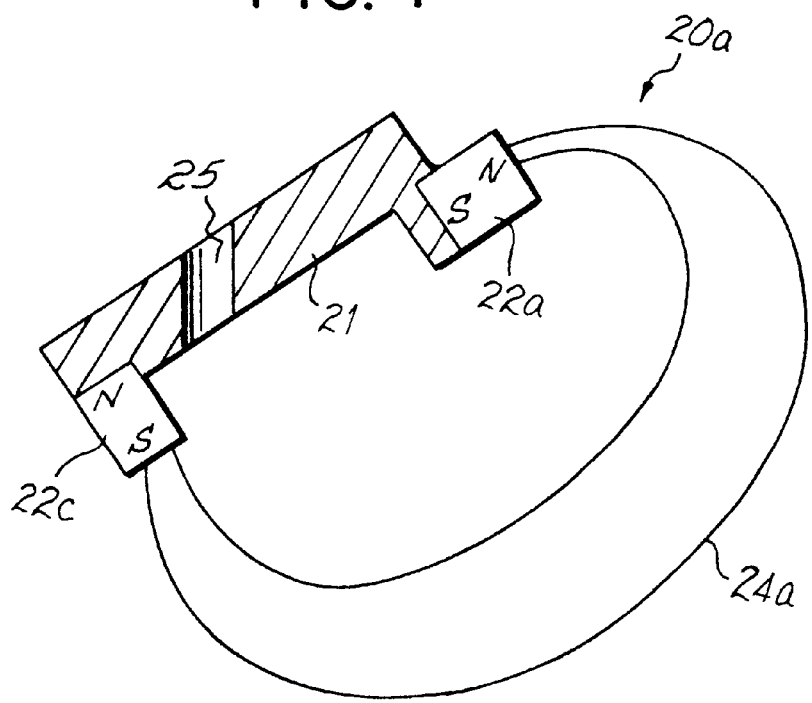
FIG. 5 is an enlarged cross-sectional view, similar to FIG. 4, illustrating an alternative magnet assembly.

An alternative magnetic arrangement is shown in FIG. 5. This simpler design is expected to lead to lower target utilization than that shown in FIG. 4. The magnet assemblies 20 are preferably designed so that at least a portion of a magnetic tunnel traps plasma over the target 10 so that a net erosion of the target 10 takes place at all times over the target life so that no net redeposition takes place on the target 10. One way this can be achieved is by placing the intermediate magnet ring 22b sufficiently far from the target so that its field does not cancel the tunnel formed by field lines of the main tunnel 26 that extend between the opposite poles of the inner and outer magnet rings 22a and 22c.

The magnet packs contain a number of holes 25 bored parallel to the axis which carry the feedthroughs for water and DC power leading to the target. The assembly of magnets 22 is coated with a hard polymer coating such as polyurethane or enclosed within non-magnetic metallic or plastic cladding pieces, which are bonded to the magnet pack 20. This coating prevents the magnets 22 and yoke 21 from becoming oxidized in air and also prevents the magnets 22, which may be of sintered construction, from becoming a contaminating particle source.

Figure 6A:
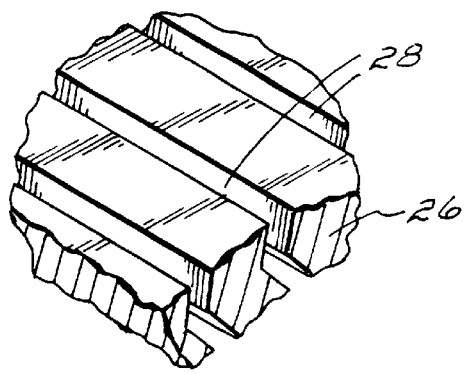
FIG. 6A is a cross-sectional view of the circled portion of FIG. 6.
Figure 6:
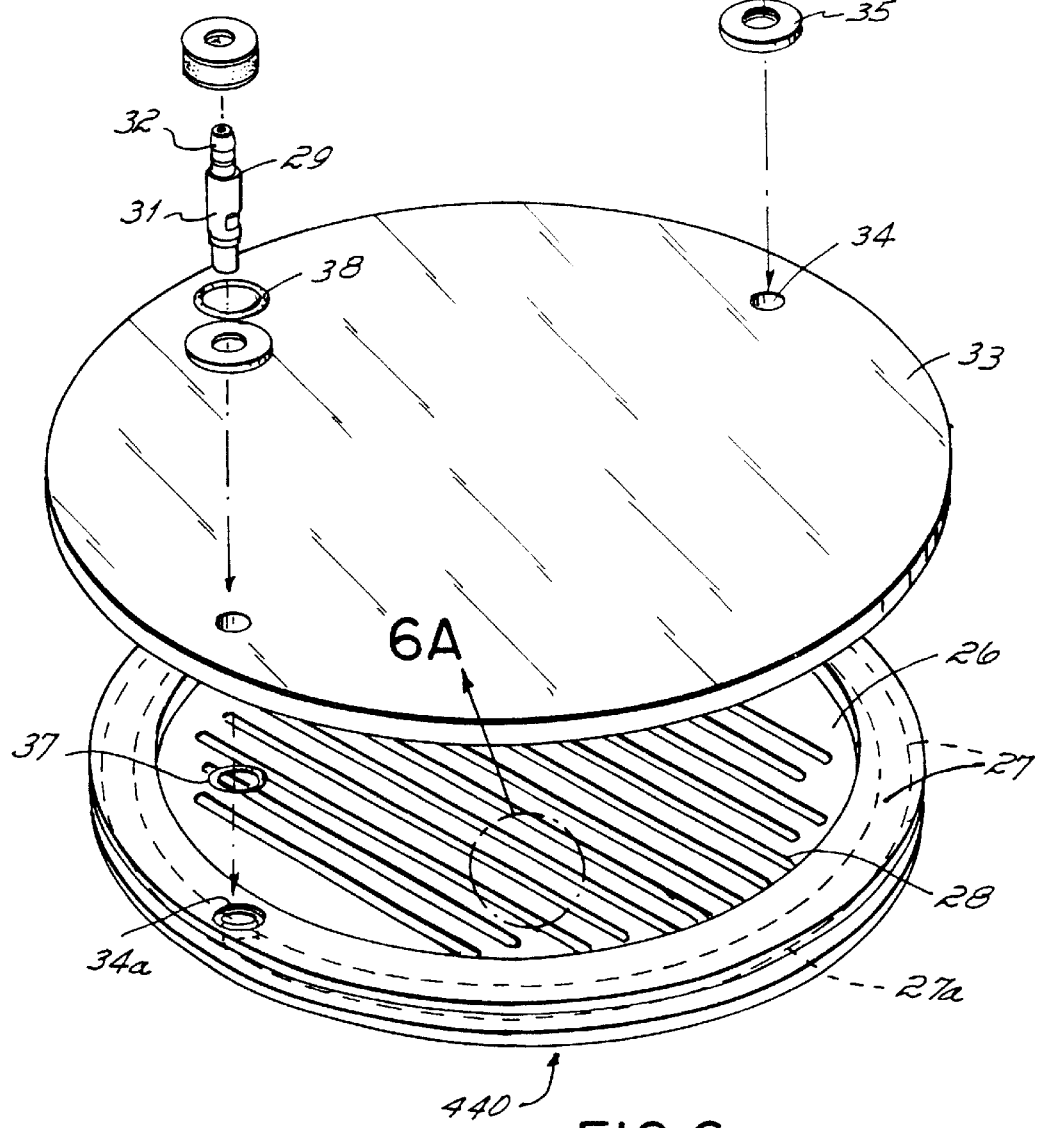
FIG. 6 is a disassembled perspective view of the shield and window assembly of the IPVD source of FIGS. 1C and 1D.

The IPVD source 503 also includes a window and window shield assembly 440, which is illustrated in FIG. 6. The shield and window assembly 440 includes a dielectric window 33, formed of a lapped, high purity alumina plate 7 mm thick, and a window shield 26, formed of an electrically conductive material such as aluminum or copper. For metallic coating material, the shield 26 is preferably made of metal and may function as a Faraday shield. The shield 26 has an integral cooling water channel 27 formed therein and defined between an annular rim portion of the shield 26 and an annular channel cover ring 27a braised or welded to the rim 27a of the shield 26. A number of slots 28 are milled into the shield 26. The slots 28 are preferably chevron-shaped in cross section, as illustrated in FIG. 6A, or have some other cross section that blocks line of sight paths and protects the window 33 from direct deposits of coating material from within the chamber 501. The dimensions of the slots 28 are optimized by computer modeling to balance transparency of the shield 26 to RF energy against minimum transmission of sputtered material from the process region of the chamber 501 to the dielectric window 33.

Water connection to the channel 27 of the shield 26 is made via stainless steel stubs 29 which thread into the shield 26 and make a water seal via O-rings 30. Each of the stubs 29 has external threads 31 and a conical tapered end 32 on which a smooth finish has been placed. The assembly of the shield 26 with stubs 29 attached is assembled to the window 33 by inserting the stubs 29 through holes 34 in the dielectric window 33, which align with holes 34a, which are 180° apart around the rim of the shield 26 and which communicate with the channel 27. There are two holes 34 through which the water stubs pass, one for water inlet and one for water outlet. TEFLON washers 35 and aluminum knurled nuts 36 are screwed onto the stubs 29 and compress O-rings 37 between the window shield 26 and the window 33 forming a vacuum seal around the water stubs 29. O-rings 38 are provided in the nuts 36, which have no sealing function but perform the function of a spring, helping to prevent over-tightening of the nuts 36.

A dense secondary plasma for ionizing material that has been sputtered from the target 10 is excited by an RF coil assembly 450, illustrated in FIG. 7, which includes a three-dimensional coil 39 whose configuration and electrical performance and properties are described in U.S. patent application Ser. No. 09/277,526, filed on Mar. 26, 1999, entitled Process Apparatus And Method For Improving Plasma Distribution And Performance in an Inductively Coupled Plasma, invented by Jozef Breka, an inventor herein, hereby expressly incorporated herein by reference. The RF feeds to the coil are provided by a pair of male connectors 40 that thread into sockets 41 in the coil end pieces 42. Water feed is provided through a pair of threaded pipe couplings 43. These couplings are surrounded by a flange 44 with an O-ring groove 45.

The coil 39 is mounted within a high dielectric insulating cup 46 made of a material such as TEFLON. The thickness of material of the cup 46 in various areas of the cup surface is calculated to be as thin as possible consistent with the suppression of arcing to the nearest conductive surface. To make this calculation, the effective field and pressure-distance product in air are calculated for the stack consisting of the TEFLON, an air gap, and any other dielectric such as the source window 33. The thickness of TEFLON can be set so that the field is always lower than that required to cause breakdown of air, for reasonable values of the air gap. This calculation allows the cup thickness to be minimized safely. A minimum thickness allows the best coupling to the plasma and lessens the constraints on the dimensions of the coil 39.

The cup 46 is mounted in an aluminum ring 47. This ring is mounted to the water cooling assembly 422 using shoulder screws 62 and springs 63 which, in operation, press the ring against the dielectric window 33 which is part of the window and shield assembly 440 described above. This window 33, in turn, is pressed against the target upper O-ring 48, which is located in the groove 11. This spring loading compensates for tolerance mismatch and mechanical deformation and so holds the vacuum seals together and allows the system to be pumped down.

The ring 47 also features a canted coil spring 49 and a tube 50 for cooling water. There are two axial holes 51 in the ring 47 through which shield water stubs 29 from the window shield can pass (FIG. 8). Recesses 52 are provided around the holes 51 in the back of the ring 47 for TEFLON washers 53.

An aluminum enclosure 54 is mounted over the coil 39 and held down by a bolt circle so that there is electrical continuity through the canted coil spring 49, to the aluminum ring 47. The purpose of this is to prevent water leaks, if any, from reaching the high voltages present on the coil and to act as a primary barrier to RF emission from the source. RF energy can escape only through the dielectric window 33 into the process space of the chamber 501. The enclosure is pierced in four places, two ports 55 carrying RF feeds and two ports 56 carrying water feeds for the coil 39. TEFLON parts 57 are passed through the water feed ports 56 and pass over O-rings 45 making a water seal. This provides secondary containment so that a water leak in the coil water coupling does not lead to water being in contact with the RF elements. TEFLON insulating pieces 58 are used to stand the coil and RF connectors off electrically from the enclosure. TEFLON combs 59 are used with insulating screws to hold the coil down to the cup 46. This leads to consistent behavior between different sources.

Figure 9:
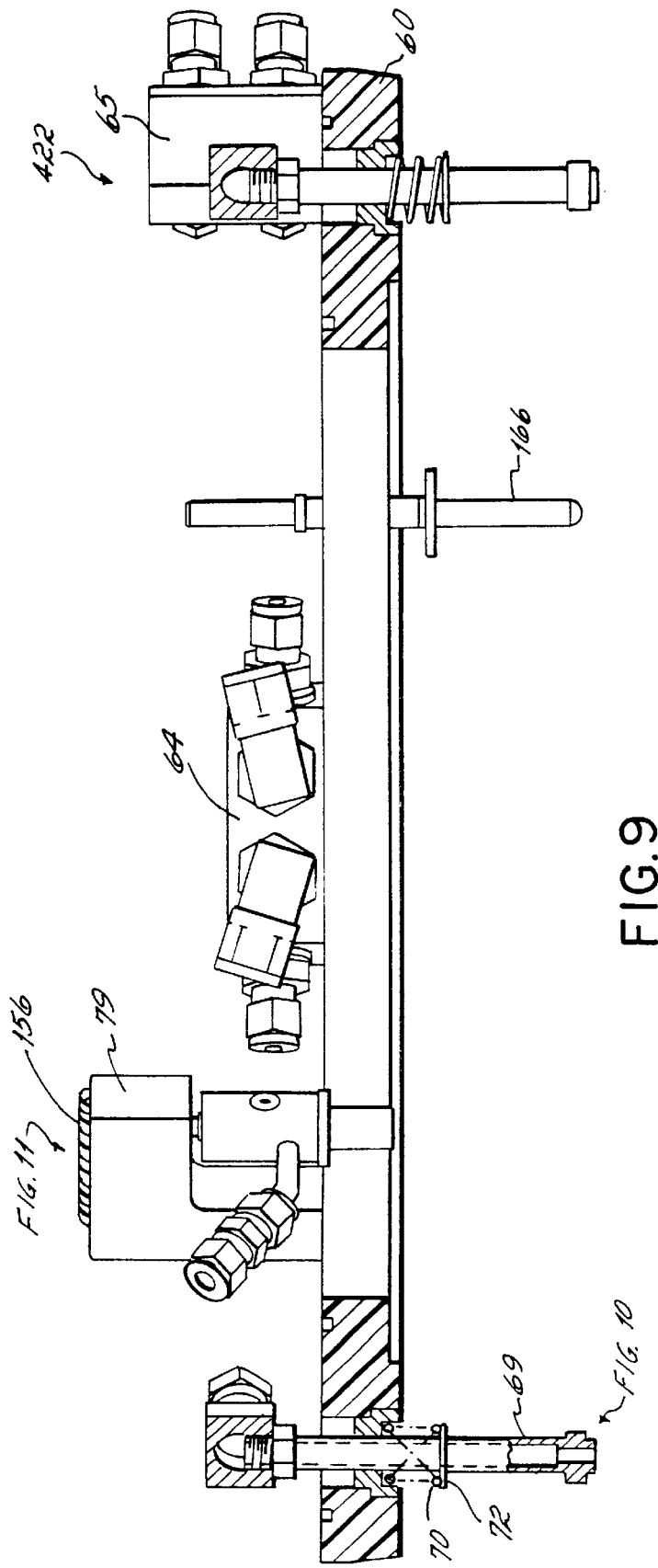
FIG. 9 is an axial cross-sectional view of cooling manifold mounting assembly of the IPVD source of FIGS. 1C and 1D, the line along which the cross section is taken being illustrated in FIG. 13, described below.

As illustrated in FIG. 9, cooling water is distributed via components mounted on a large plastic plate 60 which also supports the magnet assembly 430, which is mounted thereto on spacers 61, and the RF source assembly 450, which is mounted thereto using the shoulder screws 62. A main aluminum manifold block 64 is mounted to the plate 60 and brings in water from the exterior of the source via threaded connections. A secondary manifold 65 allows the flow of water through the coil to be checked by a flow sensor mounted outside the source and also allows connection of the water flow to a cooling channel in the source flange and dark space ring assembly 470.

Figure 10:
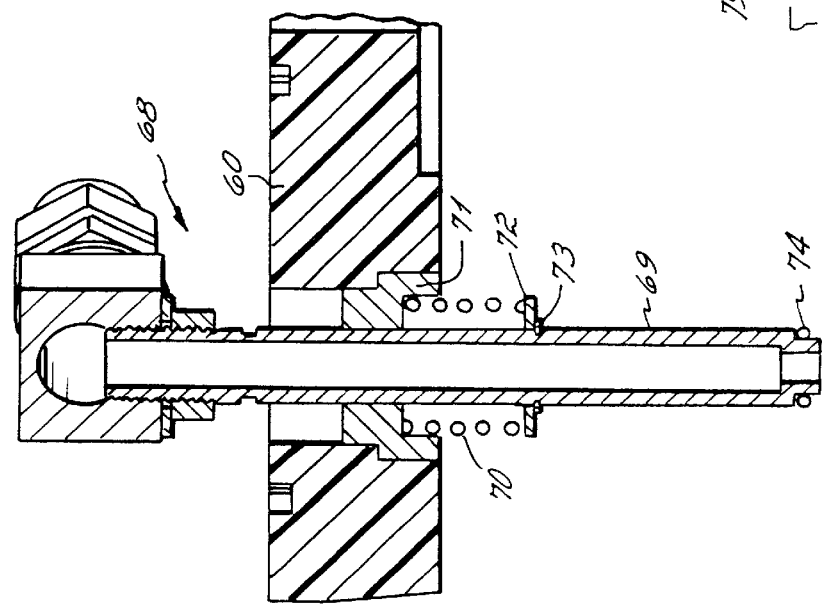
FIG. 10 is an enlarged cross-sectional view of one embodiment of a fluid coupling assembly portion of the assembly of FIG. 9, the line along which the cross section is taken being illustrated in FIG. 13, described below.

Cooling water for the target 10 passes through stub assemblies 68, as illustrated in FIG. 10. The assemblies 68 are designed so that water couplings 69 can be assembled through holes no larger than the outer diameter of the coupling tubes themselves; which allows the holes 25 in the magnet pack to be of minimum diameter, which minimizes the disturbance of the magnetic field that these holes might cause. The assemblies 68 are spring loaded, the springs 70 acting between metal cups 71 that are pressed into the plastic mounting block 60 and washers 72 that are held in place on the water tubes 69 by retaining rings 73. In this way, in operation, the lower end of the cooling tube bears on an O-ring 74 that is forced into a specially designed detail in the target cooling cover 13. The detail is a doubly tapered bore similar to that used in ISO and SAE standard fluid connecting glands.

Figure 11:
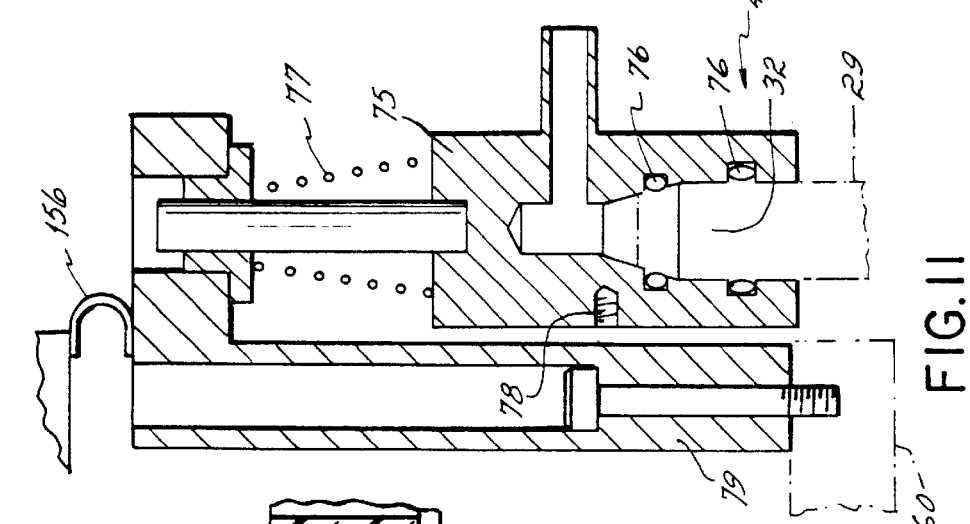
FIG. 11 is an enlarged cross-sectional view of the mounting connector assembly of the assembly of FIG. 9 for the window and shield assembly of FIG. 6, the line along which the cross section is taken being illustrated in FIG. 13, described below.

The window shield 26 is cooled via special couplings 75 that also make a DC connection 423 to the shield, as illustrated in FIG. 11. The coupling features a tapered recess with an inward facing O-ring 76. The entire fitting is spring loaded via springs 77; and when assembled, the tapered surface of the stub 29 is forced hard against the O-ring 76; making a water seal. The canted coil spring 77 performs a double function. Firstly, it makes electrical connection to the shield 26. Secondly, it performs a latching function, engaging a shallow recess in the stub 29 which holds the shield 26 approximately in place after it has been installed to the water housing 422. Finally, this coupling bears a tapped hole 78 for making electrical connections. The coupling inserts into the RF assembly through the TEFLON washers 53. Support blocks 79 are mounted on the block 60 and support the coupling, and they also apply pressure to the springs 77, These blocks are fitted at their upper end with contact fingers 156 which ground the entire assembly, and through it the Faraday shield, when the source is assembled, by making contact to the source housing 1.

Figure 12:
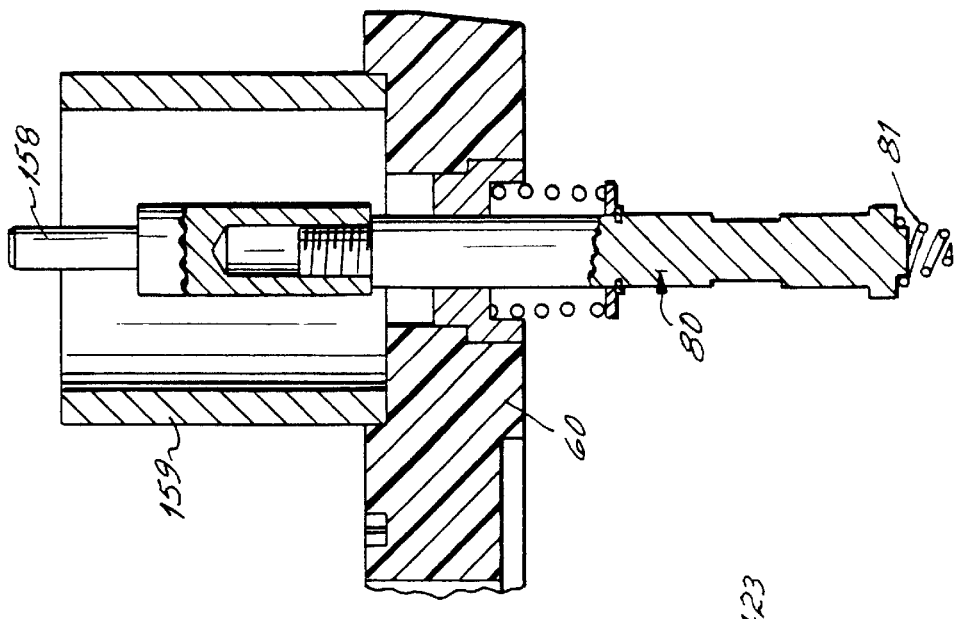
FIG. 12 is an enlarged cross-sectional view of a DC contact stub portion of the assembly of FIG. 9 of the IPVD source assembly of FIGS. 1C and 1D, the line along which the cross section is taken being illustrated in FIG. 13, described below.

The block 60 also contains supports for two non-water-related items. One is the DC contact stub 80, which is spring loaded similarly to the target water couplings, as illustrated in FIG. 12. In this case, the stub 80 is forced against the target cooling cover, contact being ensured by another canted coil spring 81. The upper end of the stub is fitted with a male connector 158. This DC connector stub assembly is surrounded by a plastic tube 159 that protects it from spray in the event of a water leak in the source. The other item is a spring-loaded pin 166 (FIG. 9) that passes through the magnet pack and bears against the target cooling cover 13 (FIG. 3). When the source 503 is assembled, the upper end of this pin 166 bears on another plunger assembly 7a described above, which, in turn, activates a microswitch 7. The activation of this switch 7 indicates that the target assembly 420 is correctly installed and, therefore, that it is safe to turn on the cooling water.

The water distribution assembly 422 contains a number of couplings and a considerable length of TEFLON hose. In the event of a leak developing, it is desirable that water be drained to the exterior of the source and taken somewhere it can be detected. Therefore, the block 60 contains a pattern 82 of drainage grooves that terminate at small holes 83 (FIG. 2) in the source housing 1.

Figure 13A:
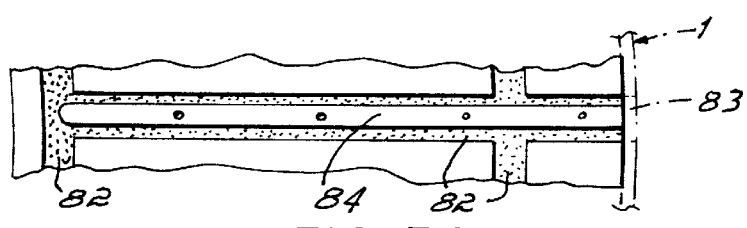
FIG. 13A is an enlarged view of the encircled portion marked 13A in FIG. 13.

Vacuum leak checking of the source should be carried out. The inner target O-ring as well as the window seal O-rings are rather relatively inaccessible. For this reason, the block 60 is also provided with stainless steel capillary tubes 84, which are embedded into some of the grooves 82 as shown in FIG. 13A. During leak checking, these tubes 84 can be used to feed helium to the vicinity of the inaccessible O-rings.

Figure 14:
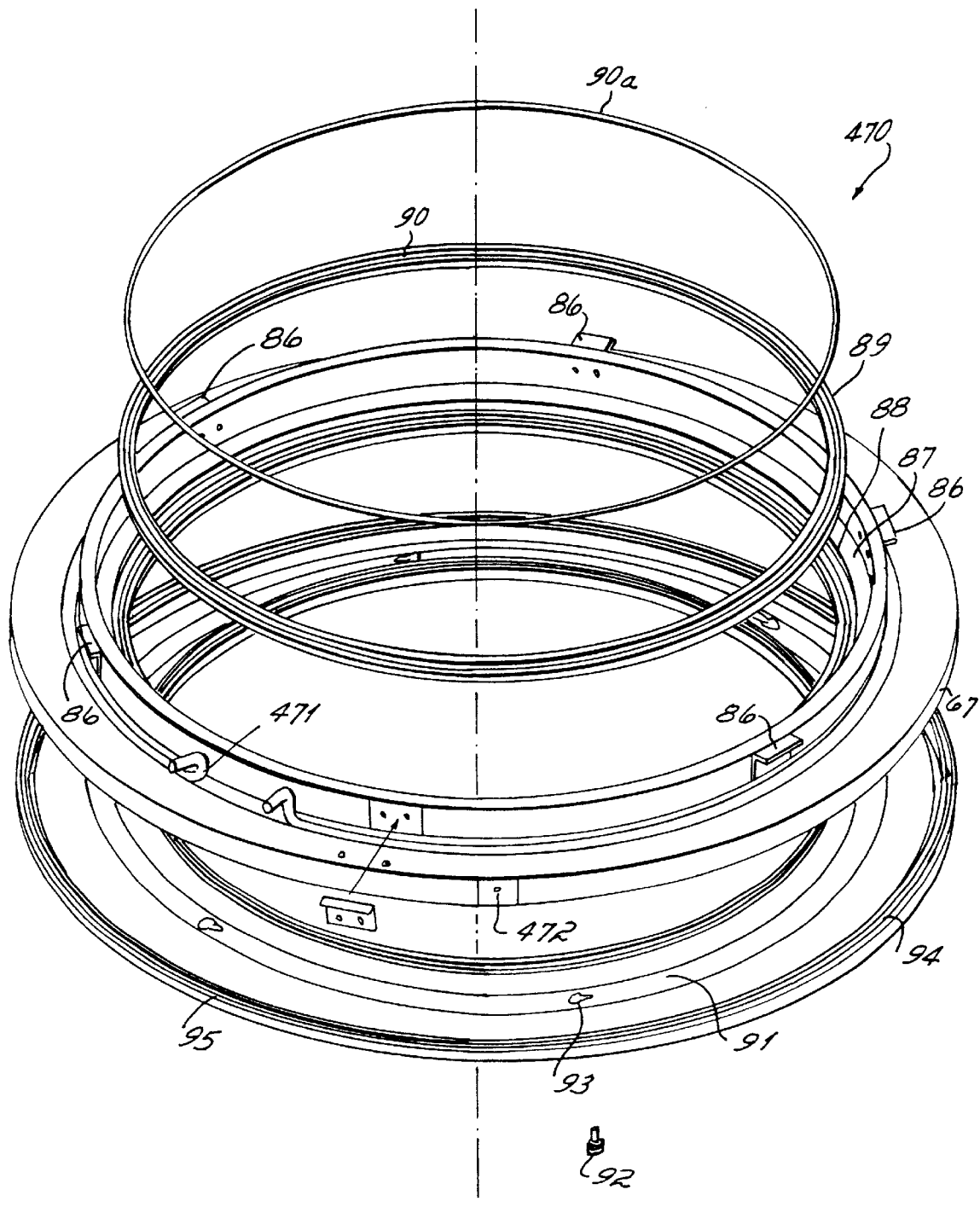
FIG. 14 is a disassembled perspective view of the IPVD source flange and dark space shield of the IPVD source assembly of FIGS. 1C and 1D.

Referring to FIG. 14, the source flange and dark space ring assembly 470 is illustrated. This assembly 470 includes a source flange 67 on which is mounted the fixed parts 86 corresponding to the clips 9. A swaged-in cooling water tube 471 is provided. The upper side bears a recess 87 with an O-ring groove 88 into which is inserted a TEFLON insulator 89, which is itself provided with an O-ring groove 90. Weep holes 472 are provided leading from the recess 87 to the outside diameter of the flange, which provide drainage and visual warning in the event of a cooling water leak. The O-ring groove 90 bears an O-ring 90a that interfaces to the target 10, forming the outer vacuum seal. The underside of the source flange 67 has another recess into which is mounted the dark space shield 91. This shield 91 is held in place by shoulder screws 92 that tighten into slot features 93. To remove the shield 91, the screws 92 are slightly loosened and the shield 91 then slightly rotated and lifted off. The shield 91 is designed so as to not contact the source flange 67 in regions near the O-ring groove 88 to avoid overheating of that O-ring. The source flange 67 interfaces electrically to the process chamber electrically, using a canted coil spring 94. An O-ring 95 makes the vacuum seal.

There are several features or considerations relating to the IPVD source 503. Assembly and dismantling for repairs is one. In assembly, the fully assembled source interior (less Faraday shield assembly 440 and target assembly 420) is dropped into the upturned source housing assembly so that the DC connector 158 (FIG. 12) inserts into the socket 4 (FIG. 2). Six screws are inserted and water connected to four ports 151, 152. Electrical feeds are plugged in. The source 503 is then ready for use. Dismantling is the reverse of assembly. This simple assembly technique is an advantage of the modular construction of the source. Routine target replacement is another such feature or consideration. After cooling water has been blown out, the source 503 is inverted and the clips 9 released. The flange assembly is then lifted off. The target then can be lifted out and then the Faraday shield assembly can be removed. No tools are needed except to release the dark space shield 91.

Figure 15:
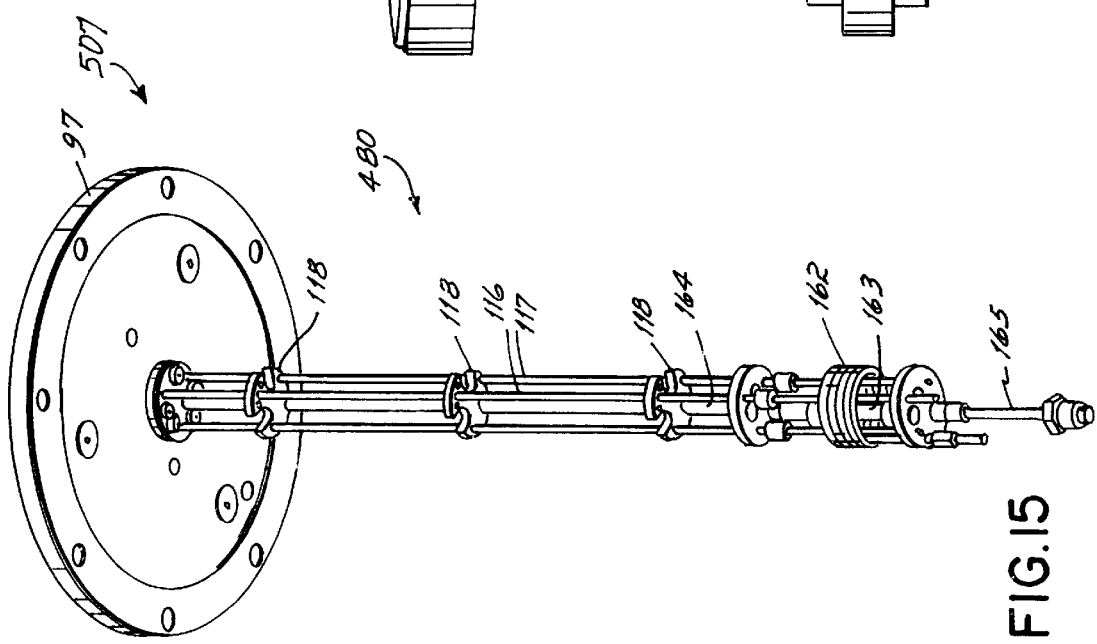
FIG. 15 is a bottom perspective view of the electrostatic chuck wafer support assembly of the apparatus of FIG. 1.

The electrostatic chuck 507 and the wafer transfer system 504 cooperate in the transfer of wafers from one to the other. The chuck assembly 507 includes a service support assembly 480 as illustrated in FIG. 15, which includes the wafer support, holder or chuck 97. A suitable chuck 97 may be obtained from INVAX Inc. or other sources. A fluid passage is provided for the passage of cooling fluid, for example, a GALDEN brand perfluorinated fluid. The chuck 97 is of the tripolar type, having two embedded, electrically isolated, electrodes for the application of a chucking voltage, while RF bias can be applied to the chuck body by way of the electrostatic chuck electrodes. The RF is thereby coupled through to the embedded electrodes and thus to the wafer.

All metal parts of the chuck are aluminum coated with a proprietary dielectric. Back side gas can be provided through a central hole. A thermocouple is mounted to the rear of the chuck.

The chuck 97 has a number of counterbored holes and is mounted to the stainless steel base 98 using screws; there are polyimide 'vespel' insulators that protect the chuck from damage by the screws and provide electrical isolation. An insulating block 99 isolates the chuck from the base.

Figure 16:
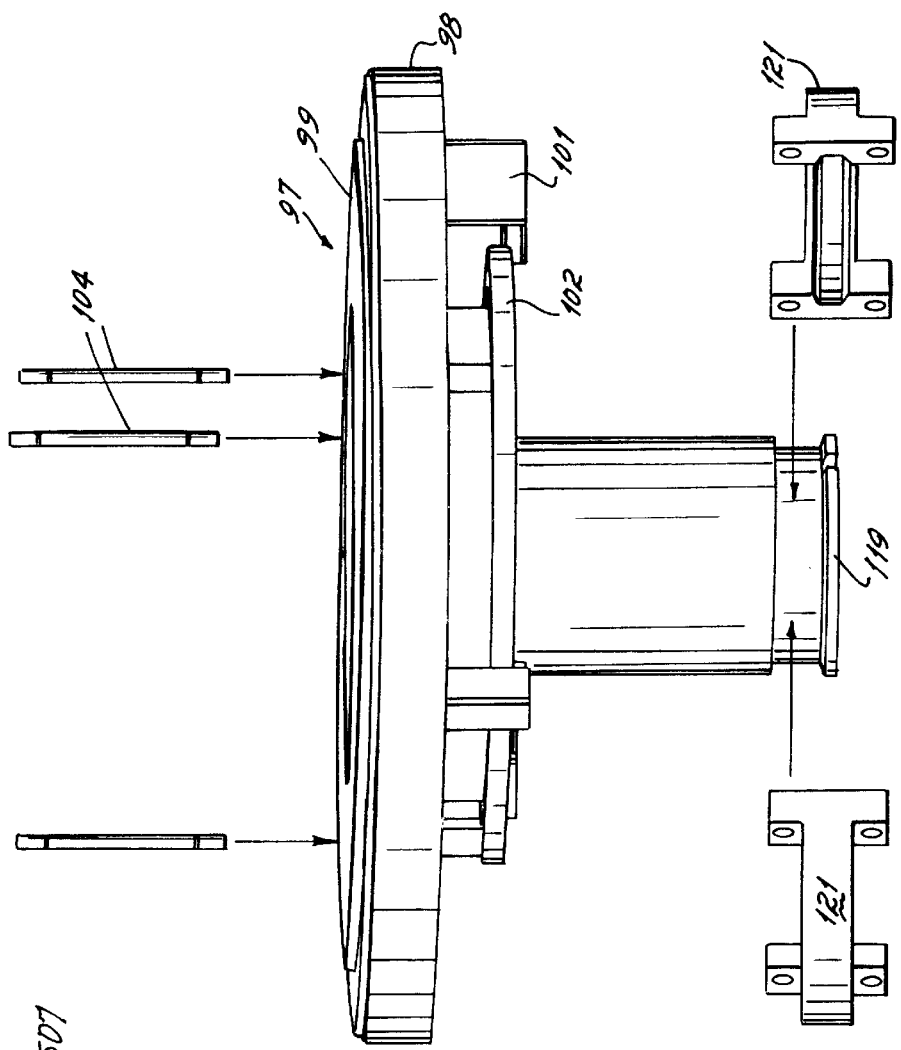
FIG. 16 is a side disassembled perspective view of the wafer support and lifting assembly portion of the apparatus of FIG. 1 for the wafer support of FIG. 15.

FIG. 16 shows the mounting of the chuck to its support structures. The stainless steel base 98 is fitted with rest pegs 101, which support a ring 102. The ring has features which work with those on the rest pegs to give an accurate alignment of the ring with the chuck. This ring has sockets 103 that are fitted with ceramic lift pins 104, which pass through holes in the chuck. The ring 102 rests on the pegs 101 during process. As the table is lowered to the wafer transfer position, the ring intercepts a separate assembly as described below, and is lifted off the pegs, causing the pins to rise through the chuck and to lift the wafer off the chuck ready for transfer to a handler. The base has a short downward extending tube at the end of which is a flange 119 that can be clamped to the Z drive assembly 490 described below.

There are two configurations of shields for this table. In the simplest case, a stainless shield 105 (FIG. 22) rests on a step 106 on the base 98 (FIG. 17) and shields the chuck from metal deposition. Alternatively, a grounded shield is supplemented by a ring (not shown), which rests directly on the chuck. This ring may be made of aluminum or stainless steel and may, or may not, be coated with a dielectric material, possibly of high dielectric constant similar to that used in the chuck dielectric. This ring couples to the RF power that is applied to the chuck through the chuck dielectric. Advantages of this are that the shield can be in very close proximity to the chuck, thereby more effectively blocking metal deposition: and that RF power is applied to the ring causing it to attain the same bias as the wafer, which lessens the distortion of electric fields near the wafer edge. The ring over laps but is separated from the grounded shield. This provides a convoluted path for metal deposition and keeps material from being deposited on the chuck.

Figure 17:
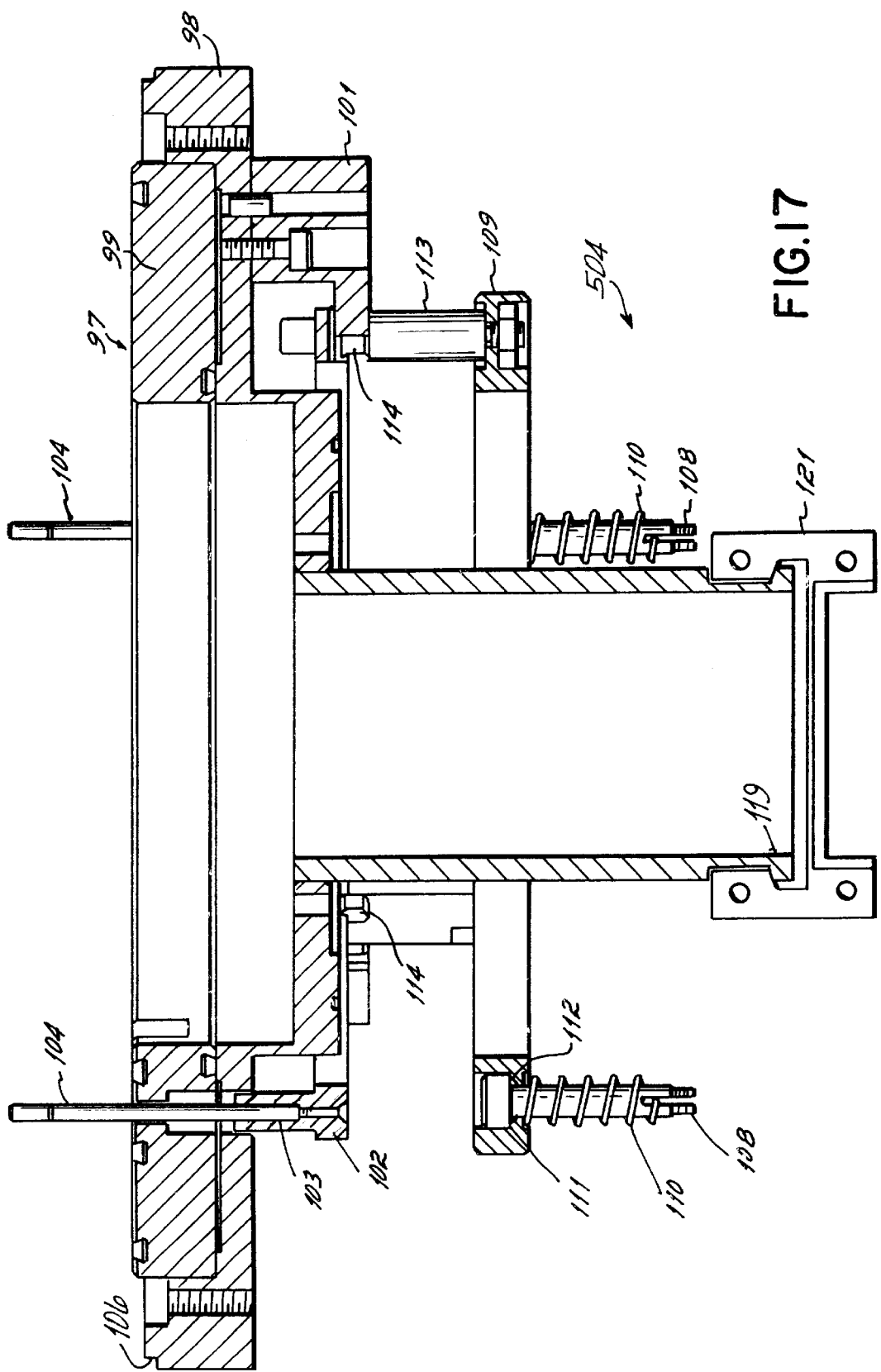
FIG. 17 is an axial cross-sectional view of the wafer support assembly portion FIG. 16.

The wafer transfer mechanism 504, illustrated in FIG. 17, is attached to the base of the chamber wall assembly 502 (FIG. 19) using the threaded pegs 108. A ring 109 is held in a raised position by springs 110. It is held in an accurate position by the features 111 and 112. Slotted pegs 113 are mounted to this ring. When the table or chuck is lowered, the pegs 101 descend into the slots 114 in the slotted pegs. The ring 102 is lifted and the pins 104 raised. When the pins have lifted 11 mm, the pegs 101 reach the bottom of the slots 114. Usually the transport system would now insert a pick to collect the wafer. Further lowering of the table compresses the springs 110 causing the entire system including the wafer on the pins to be lowered onto the pick. The pick is now removed, bearing the wafer. Bellows 115 form a vacuum barrier while allowing the table to be raised and lowered. Service support assembly 480 includes a rigid assembly 116, formed by three silver plated brass tubes 117 with nylon spacers 118 at regular intervals and a silver plated plate at each end, is fixed to the chuck with screws. It has a triple function that includes: (1) mechanical support of the chuck voltage wires, thermocouple wires, temperature control fluid tubes, and backside gas tube; (2) RF power conduction to the chuck body; and (3) conduction of nitrogen purge gas to the space behind the chuck. At low operating temperatures, water condensation hinders chuck operation unless a gas purge is provided to sweep out moisture. In this case there are small cross holes in the support tubes near the interface to the chuck. Purge gas is connected at the lower end of the tube.

Figure 18:
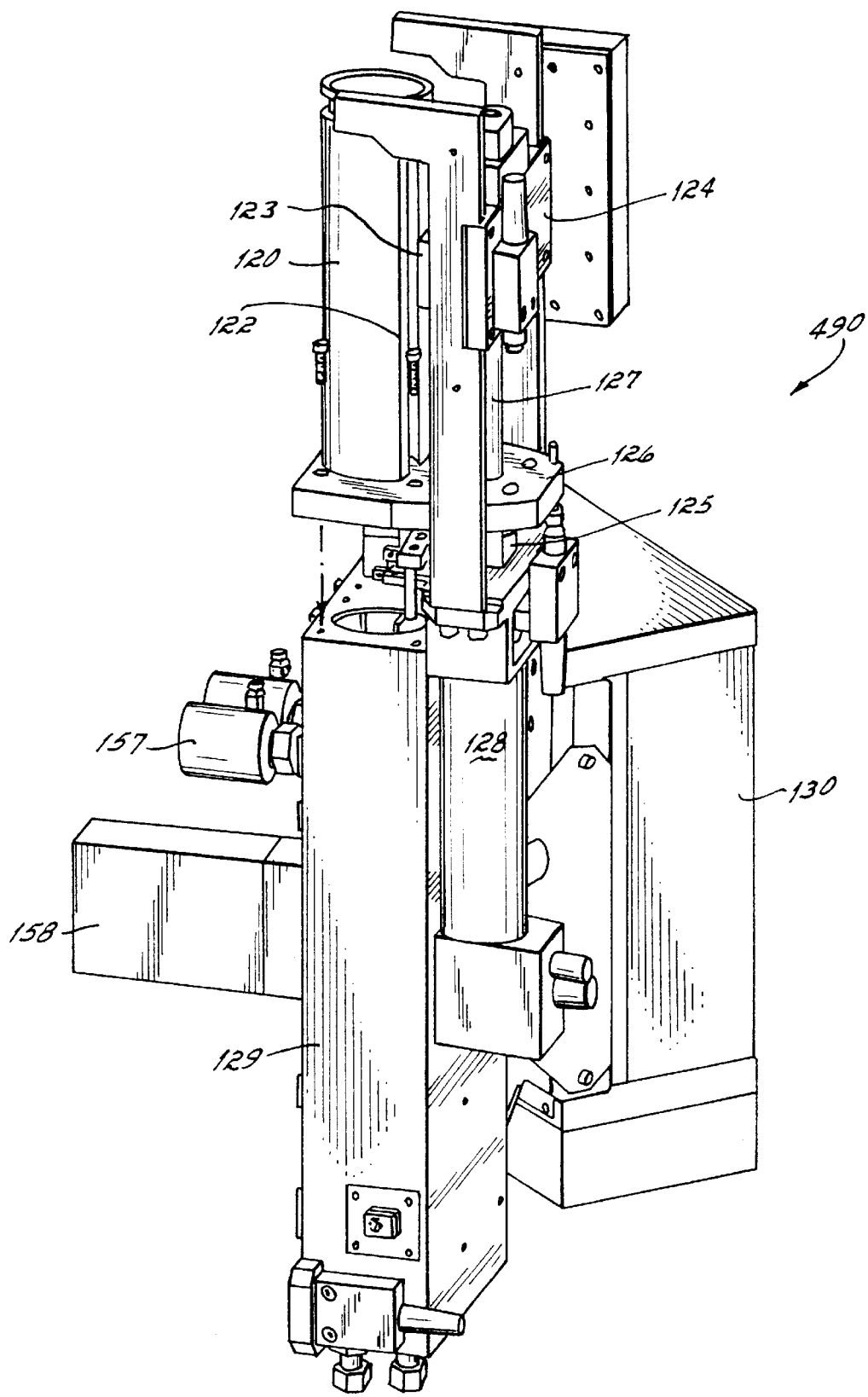
FIG. 18 is a perspective view of the wafer support vertical position adjustment assembly of the apparatus of FIG. 1.

The vertical elevator or Z drive system 490 for vertically moving and adjusting the height of the chuck 97 is illustrated in FIG. 18. This consists of a tube 120 with an upper flange that can be coupled to the table flange 119 using clamps 121. A rail 122 is mounted to the tube which rides in sliders 123 which are supported on a bracket 124. A ball nut 125 mounted to a flange 126 at the lower end of tube 120 is driven by a lead screw 127. This screw is turned by a motor and gearbox combination 128. The motor is fitted with a brake (not shown) that prevents backdriving of the motor when it is turned off. The motor control system is conventional. Position of the table is determined using an encoder mounted at the upper end of the lead screw. The bracket 124 is mounted to the process chamber.

A backside gas delivery system and components enclosure 129 is mounted below the flange 126. This enclosure contains electronics for conditioning of signals running to and from the chuck. The table RF autotuner 130, a commercial unit, is mounted to the exterior.

In one embodiment, valves and a universal pressure controller (UPC) are mounted to the exterior of the enclosure 129. These components control the backside gas delivery. In the future, these components will be moved to a position elsewhere. A plasma arrestor is used to form an insulating break in the backside gas system and avoid plasma formation in the gas line.

Figure 19:
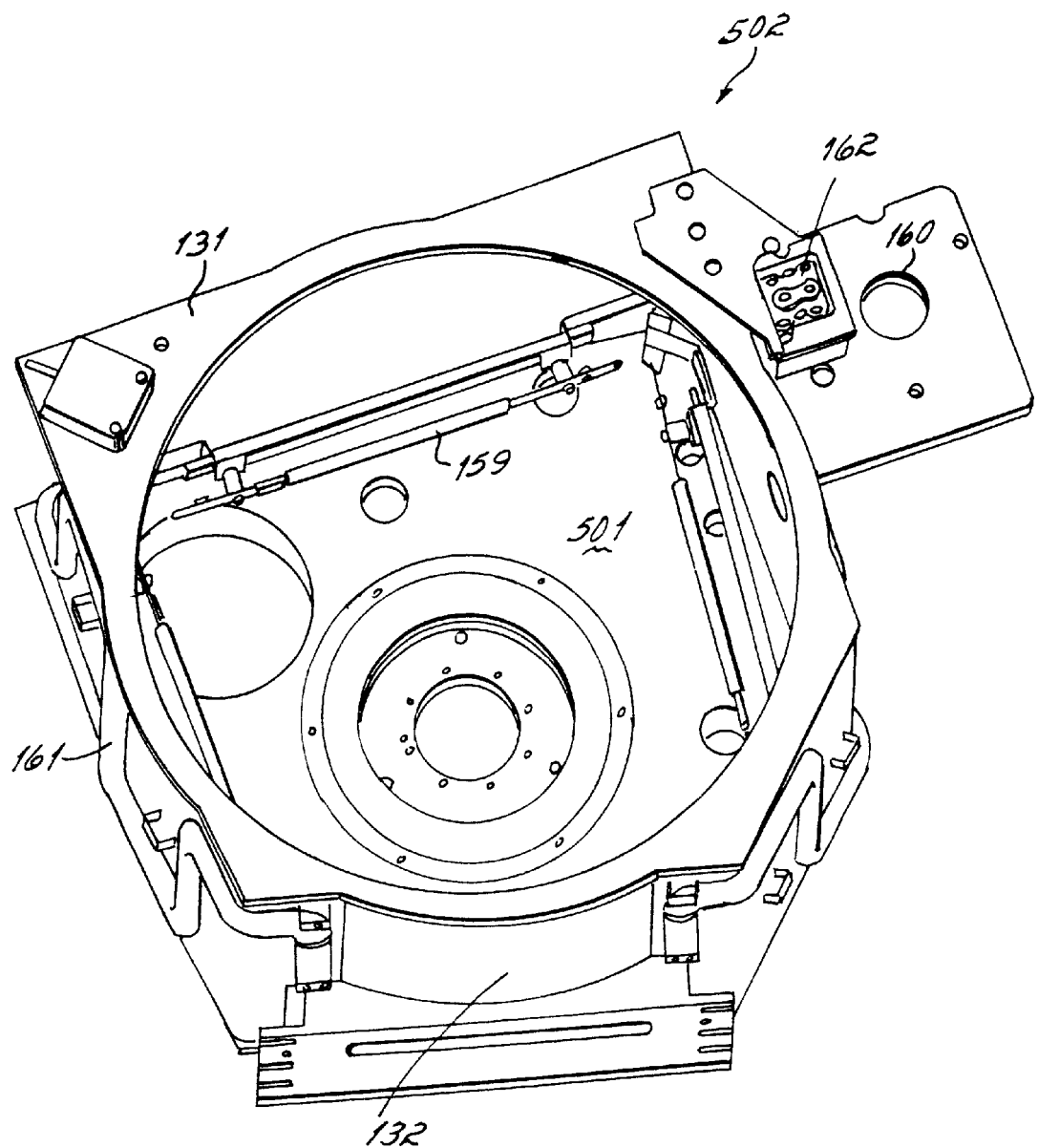
FIG. 19 is a top perspective view of the vacuum chamber wall assembly of the apparatus of FIG. 1.
Figure 20:
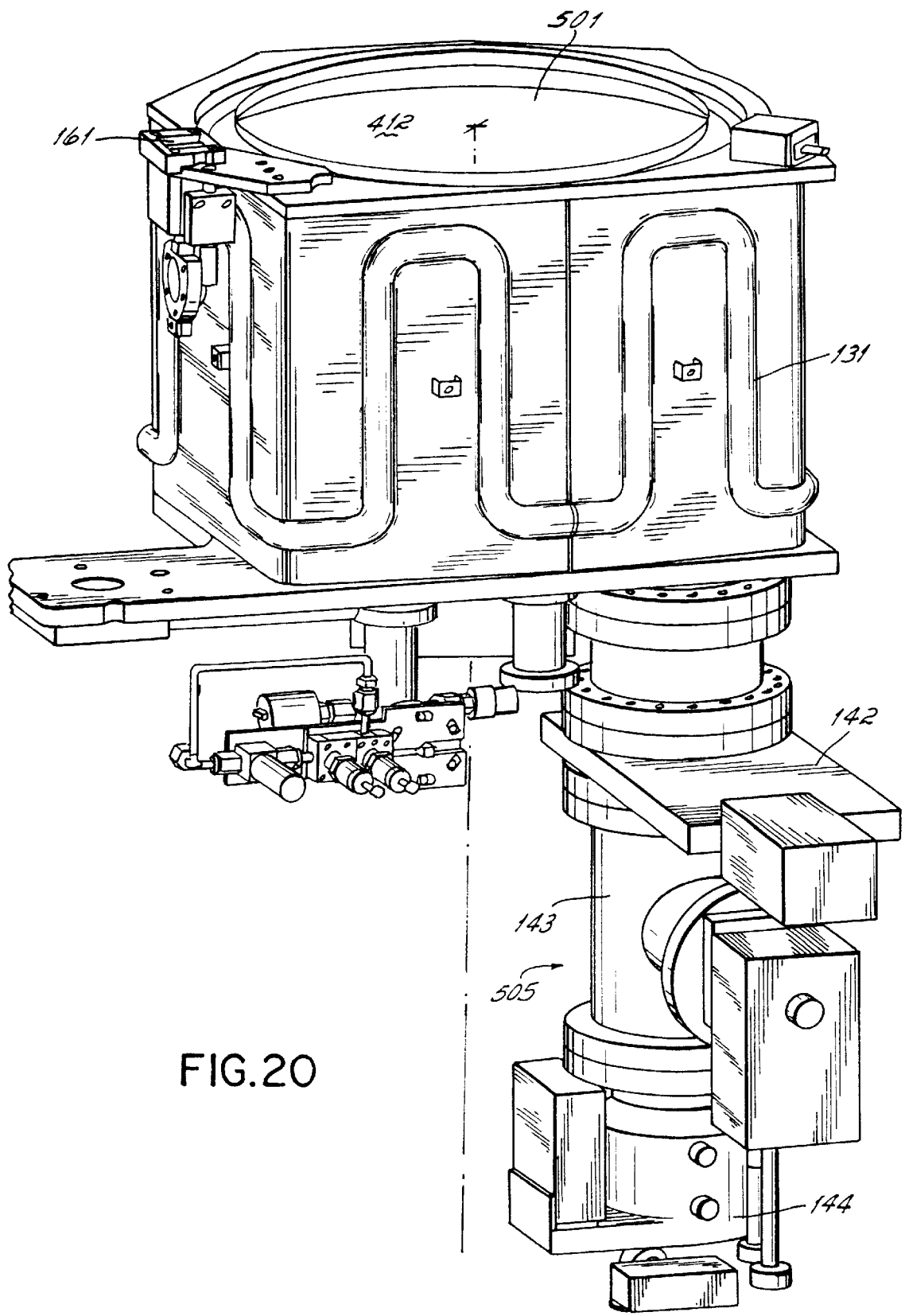
FIG. 20 is a side perspective view of the lower portion of the apparatus of FIG. 1 showing particularly the vacuum chamber wall assembly of FIG. 19 and the gas vacuum system portion of the apparatus.
Figure 21:
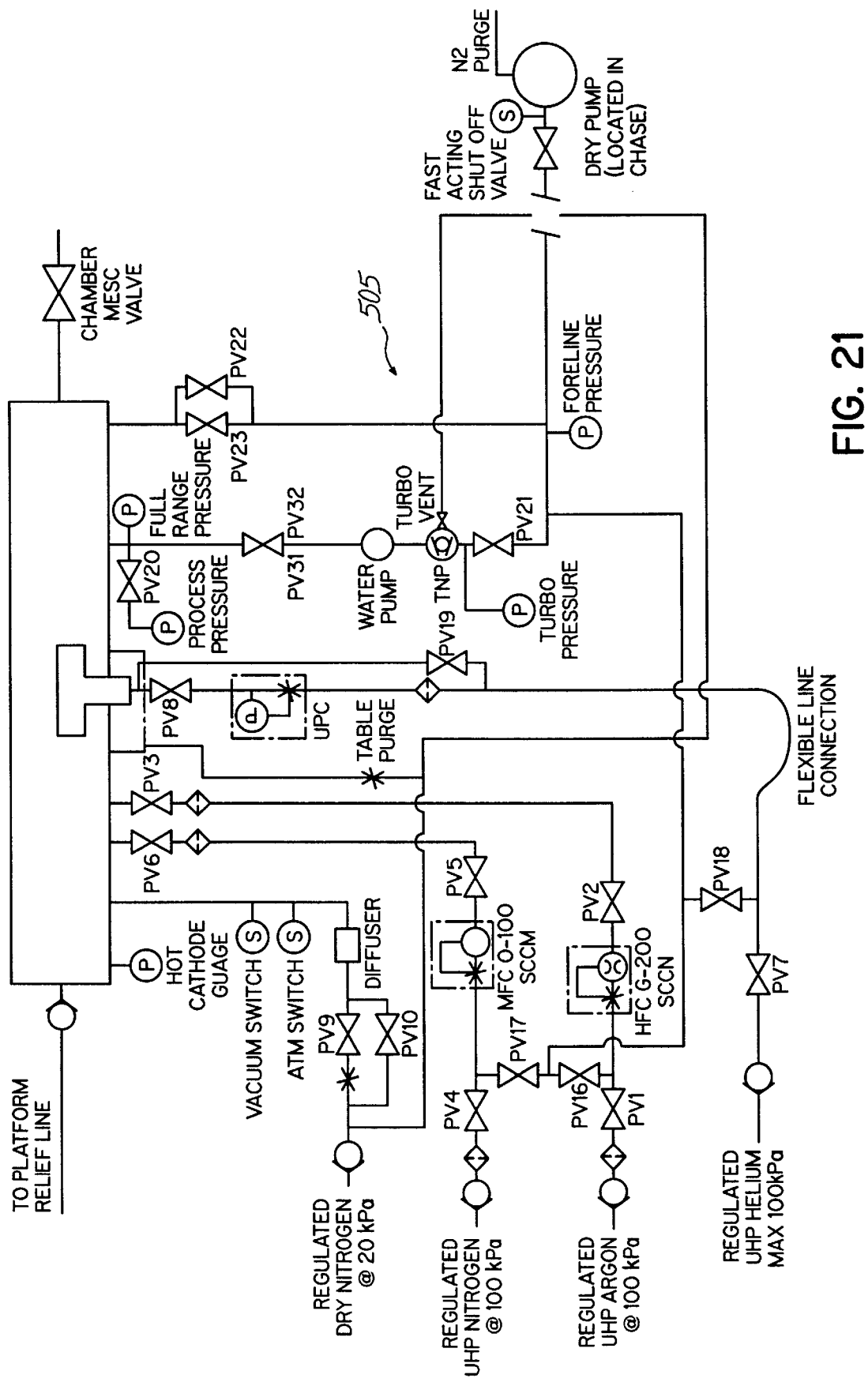
FIG. 21 is a schematic diagram of the gas vacuum system of FIG. 20.

The vacuum and gas handling system 505 is illustrated in the diagram of FIG. 21. This includes a chamber and pumping system. The chamber 501 is contained within a chamber wall assembly 502 which includes, particularly, a vacuum tight chamber enclosure 131 as illustrated in FIGS. 19 and 20, which is of a conventional stainless steel design. The enclosure 131 has an internal isolation valve 132 for coupling to a handler of the transfer system 504. There are upper and lower flanges for the source and table assemblies and appropriate flanges for vacuum metering, process gas input, etc. An eight inch conflat flange in the base couples to an isolation valve 142, and this is connected to a cryogenically cooled panel 143 operating at about 110K and a turbomolecular pump 144. The speed of the turbo pump can be controlled to allow for processing at relatively high gas pressures in low speed (about 24000 RPM) operation while rapid pump-down from atmospheric pressure is provided at high pump speeds (350 ls$^{-1}$ nominal at about 56000 RPM). The turbo pump is backed by a non oil sealed type rotary pump 145 which is also used to pump the chamber down to 100 mTorr or so after venting at which pressure the isolation valve may be opened. The vacuum arrangement is quite conventional except for the use of the water pump/variable speed turbo pump combination.

During recovery after the venting of the chamber 501, internal halogen lamps provide bake-out capability. Process plasma is also used to raise the temperature of the module interior, assisting the bake-out. In this way, pressures of 10$^{-8}$ torr or lower are achieved within several hours after a typical target change procedure.

The chamber has external water cooling channels for cooling during normal operation. A flange is provided for mounting of the source hoist. The chamber is locally stiffened around this flange by the addition of external welded ribs, to support the loads exerted when the source is raised by the hoist. A housing for the DC connector 162 for the source is also mounted on the chamber.

The gas systems for modules with and without reactive gas are shown in the schematic diagrams of FIG. 21. Delivery of argon gas to the chamber is via a simple flange. Reactive gas, if used, passes into a branched 'spider' tube 133, which carries it into the process space. The tubes end in two positions on opposite sides of the table assembly. Small covers 134 rest on the ends of the gas tubes to prevent deposition of sputtered material on the gas tubes.

Figure 22:
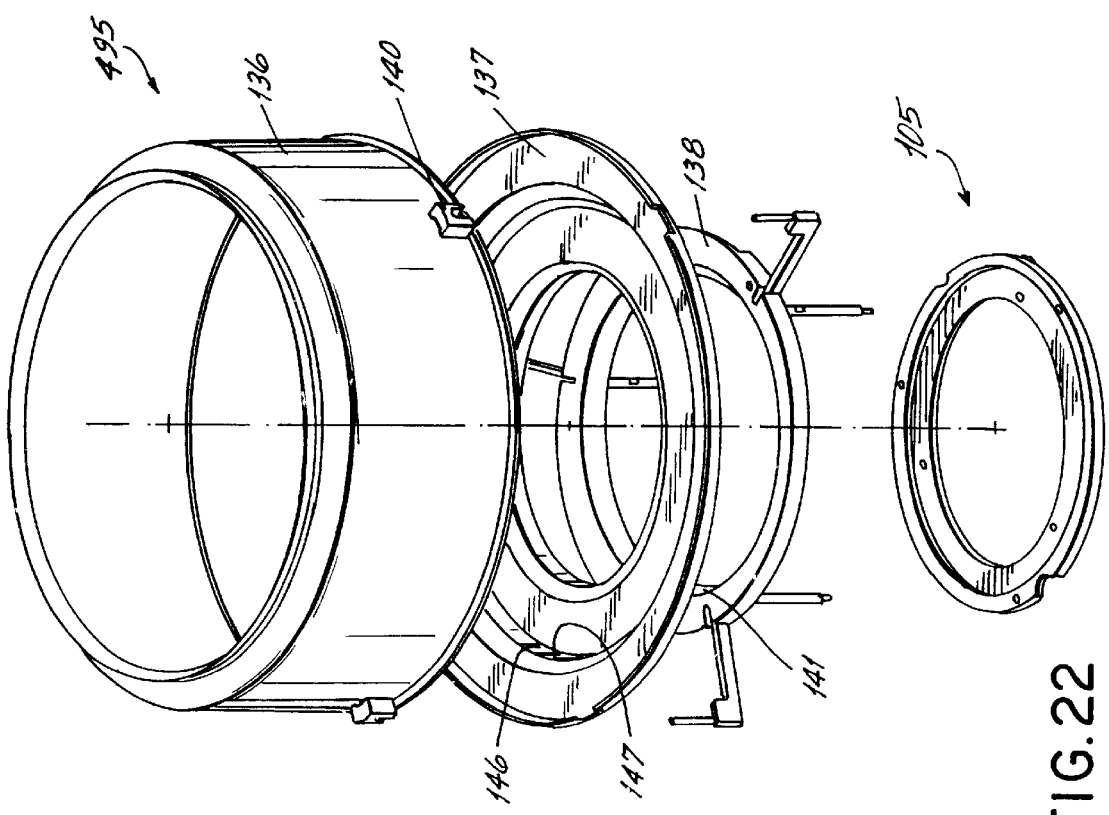
FIG. 22 is a disassembled perspective view of the sputter shield portion of the chamber wall assembly of the apparatus of FIG. 1.

A sputter shield assembly 495 is provided as illustrated in FIG. 22. These are among five shields that are subject to removal and cleaning. These are the Faraday and dark space shields described above, the table shields described above, and two chamber shields 136, 137. These chamber shields are supported on an armature 138. Upper shield 136, which typically rises to a higher temperature than lower shield 137, is supported at three points on the pegs 139 rising from the armature. Features 140 on the shield 138 rest on these pegs, centering the shield in the chamber but allowing radial motion. This avoids the buildup of stresses in the shield due to thermal expansion and deposition of hot material with subsequent differential thermal expansion. Such stresses can lead to particles being released into the system. The shield requires no tools to remove it. The lower shield 137 is inserted into the armature 138 and is supported by it. Self centering behavior arises from the chamfer 141 in the armature. No tools are required to remove the shield.

Pumping of the space within the shields should be under control throughout the life of a sputter target regardless of the history of depositions in the chamber, that is, pumping should be at the same rate regardless of the number of wafers coated. In most sputtering systems this is not well controlled. Pumping in these systems may occur through gaps whose dimensions change with chamber temperature or through holes in the shields provided for other purposes. This may lead to process issues particularly in the case of reactive sputtering. This design avoids these problems because the gap is set by the length of the pegs 139. These are short and outside the region of highest heat load and so are not significantly altered in length by thermal expansion. As a result, the gap between the shields 136, 137 is well controlled and pumping occurs all around the circumference of the process region in a controlled way. The height of shield 136 controls the gap between the source dark space shield and the shield 136. This gap is designed to be small, preferably of the order of one millimeter, to reduce the passage of metal through the gap. The shield 136 fits in a recess in the dark space shield, forming a convoluted path that intercepts metal that enters the gap between the shields before the unprotected regions of the chamber are reached. Good dimensional specification is necessary to achieve this as is attention to the thermal expansion of the parts.

The wafer is loaded through a slot 146 in the lower shield 137. During processing, this slot 146 is closed off by the table shield 105 or 106. The slot 146 may also have a surround 147 to intercept sputtered metal more efficiently.

Figure 23:
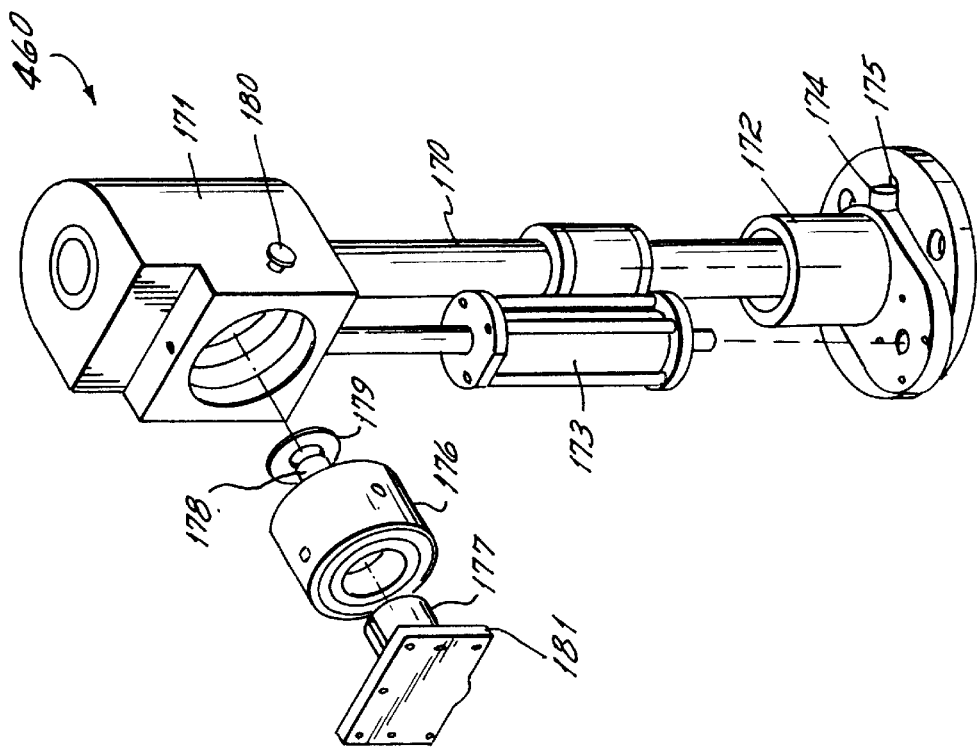
FIG. 23 is a disassembled perspective view of the IPVD source hoist mechanism of the apparatus of FIG. 1.

The source hoist 460 is illustrated in FIG. 23. The source hoist 460 is a pneumatic lift capable of raising a weight of about 200 pounds. It is required to lift the source off the chamber; it must then rotate about a vertical axis. There must also be a motion allowing the source to be turned over for target removal. The source must be lowered for easier access to the target. Considerable rigidity of the assembly is required in order that the source be maintained level when lifted off the top of the wall 502 of the chamber 501. In the arrangement used, there is a fixed vertical shaft 170 that carries an upper and lower assembly 171, 172, respectively. Both of these items contain linear bearings which can slide and rotate on shaft 170. A pneumatic cylinder 173 allows the raising and lowering of the source. Item 171 is intended to move vertically and also to rotate while item 172 rotates only, being kept aligned with item 171 by the cylinder. Rollers 174 act as bearings on which the upper assembly 172 rotates. There are recessed features 174 into which these rollers can drop. This provides some resistance to the rotation of the assembly at certain points, allowing the operator to detect the correct positions for operation.

Assembly 176 contains a pair of opposed angular bearings. Shaft 177 passes through these and is retained by a cap 178 and a spring washer 179 that pre-loads the bearings. This arrangement leads to a rotational joint with very high radial rigidity. The assembly 176 also contains a cam wheel feature that, in conjunction with a plunger 180, ensures that the source can only be rotated in one direction and can be locked in its upright and inverted orientations. The hoist mounts to the source using the flange 181.

Preferred process parameters for the deposition of tantalum and tantalum nitride in one module 500 and then deposition of copper in another module 500 of the same cluster tool are as follows:

| Film | DC Power (kW) | ICP Power (kW) | RF Table Power (W) | Pressure (mT) | $N_2$ Flow (% of total flow) | Table Temperature (° C.) |
|---|---|---|---|---|---|---|
| Cu | 8 to 15 | 1 to 5 | 0 to 100 | 50 to 75 | — | −50 to 0 |
| Ta | 8 to 12 | 1 to 5 | 0 to 150 | 80 to 120 | — | 50 to 100 |
| $TaN_x$ | 8 to 12 | 1 to 5 | 0 to 200 | 80 to 120 | 3 to 25 | 50 to 100 |

Those skilled in the art will appreciate that the implementation of the present invention herein can be varied, and that the invention is described in preferred embodiments. Accordingly, additions and modifications can be made without departing from the principles and intentions of the invention.

What is claimed is:

1. An IPVD source assembly for supplying and ionizing material for coating a semiconductor wafer, the assembly comprising:
 a housing assembly having:
  an external ground connector,
  an external target power connector,
  an RF power source connector,
  external cooling fluid recirculating ports,
  an internal target power terminal,
  at least two internal RF connectors,
  a plurality of internal cooling fluid ports, and
  electrically non-conductive support structure;
 an RF coil assembly removably secured to the housing and including:
  a three-dimensional coil removably connected across the internal RF connectors, and
  the coil having a cooling passage therethrough removably connected across at least two of the internal cooling fluid ports;
 an annular permanent magnet assembly removably secured to the housing and surrounding the RF coil assembly;
 a window assembly removably secured to the to either the housing or the coil assembly, the window assembly including a substantially flat dielectric window;
 an annular target assembly removably connected to the housing and forming a vacuum tight seal with the window when so connected, the target assembly including an annular expendable sputtering target configured to form a liquid tight cooling passage for the target that is removably connected across at least two of the internal cooling ports, the target assembly having an electrical connector removably connected to the internal target power terminal of the housing; and
 vacuum tight seal structure between the target assembly and the wall of a vacuum processing chamber when the IPVD source assembly is connected thereto.

2. The assembly of claim 1 wherein:
 the liquid tight cooling passage of the target assembly includes a target backside cover detachable from the target and defining the liquid tight cooling passage between it and the target.

3. The assembly of claim 2 wherein:
 the target assembly includes replaceable cooling liquid flow control means mounted in the liquid tight cooling passage to permit the varying of the flow of cooling liquid therethrough.

4. The assembly of claim 1 wherein:
 the RF coil assembly includes a high dielectric spacer secured to the coil and extending from the coil to the window.

5. The assembly of claim 1 wherein:
 the window assembly includes an electrically conductive shield having a plurality of electrically non-conductive features therein and connected to the dielectric window, the shield being electrically grounded or otherwise electrically connected to the housing and having cooling passages therethrough removably connected across at least two of the internal cooling ports.

6. The assembly of claim 5 wherein:
 the electrically conductive shield is a slotted Faraday shield having the plurality of non-conductive features therein configured in relation to the coil so as to permit substantial inductive coupling of the RF energy from the coil, through the window and shield while preventing substantial capacitive coupling of RF energy from the coil through the window and shield.

7. The assembly of claim 5 wherein:
 the electrically conductive shield connected to the dielectric window so as to be removable from the housing therewith.

8. The assembly of claim 5 wherein:
 the window assembly includes spacers configured to maintain the shield spaced a close distance from the window.

9. The assembly of claim 5 wherein:
 the target power connector is a DC connector to a DC power source; and
 the target is a metallic target.

10. The assembly of claim 1 wherein:
 the vacuum tight seal structure between the target assembly and the wall of a vacuum processing chamber includes an annular flange removably connected to the housing and forming a seal with the target assembly when connected to the housing and forming a vacuum tight seal with the wall of the vacuum processing chamber when the IPVD source assembly is installed on a processing chamber.

11. The assembly of claim 10 wherein:
 the annular flange is configured to connect the IPVD source assembly to the wall of a processing chamber having an source opening in the top thereof when supported on the wall around the opening by gravity and by atmospheric pressure when a vacuum is affected within the chamber.

12. The assembly of claim 1 wherein:

the external ground connector of the housing assembly includes a positive DC feed connected to the source housing and connectable to a ground connection on a processing apparatus;

the external target power connector includes a negative DC power connector mounted to the housing assembly and positioned to connect to a negative terminal connector on the wall of a processing chamber when the IPVD source assembly is mounted on the chamber wall of a processing apparatus;

the internal target power terminal includes a negative DC feed fixed to the housing assembly and insulated from ground;

the RF power source connector includes an RF tuner mounted on the source housing, having RF leads connectable to an RF power source, and having the internal RF connectors connected thereto;

the housing assembly has an interlock sensor thereon connected so as to condition the application of RF power and cooling water to the coil on proper connection of the coil, and has a further interlock thereon connected to condition the application of DC power and cooling water to the target assembly on the proper connection of the target assembly;

the target assembly is a frusto conical ring-shaped target assembly that includes a frusto conical sputtering target, a target back side cover configured to form a water tight seal with the frusto conical target to enclose the cooling liquid passage between the cover and the target, and bayonet connecting structure around a perimeter of the cover and target for connecting the target to and removing it from the cover by a rotary motion;

the window assembly includes an electrically conductive shield having a plurality chevron-shaped slots therein configured to prevent a line-of-sight path through the slots for the motion of coating material from the chamber onto the window, the shield being connected to and spaced from the window and the slots dimensioned to facilitate the formation of plasma between the slots and the window that will clean material deposited at the slots onto the window; and the coil assembly including an electrically conductive enclosure surrounding the coil so as to provide a barrier to RF emissions from the coil to the outer side of the window outside of the enclosure, the enclosure having openings therethrough for the cooling fluid ports and the RF terminals of the coil.

13. The assembly of claim 10 further comprising:

a plurality of hand operable fasteners securing the annular flange to the housing and releasably securing the target assembly to the IPVD source.

14. An ionized physical vapor deposition apparatus comprising the assembly of claim 1 and further comprising:

a vacuum chamber having a chamber wall surrounding a vacuum processing space inside of the chamber, the chamber wall having an opening therein at one end of the chamber;

the IPVD source assembly situated in and forming a vacuum tight closure of the opening in the chamber wall;

a gas supply system connected to the chamber so as to supply a gas into the processing space;

a vacuum system connected to the chamber and operative to maintain gas in the processing space at a vacuum pressure level;

an RF energy source outside of the chamber;

a substrate support inside of the chamber opposite the processing space from the iPVD source and having a wafer supporting surface thereon facing the processing space.

15. An ionized physical vapor deposition apparatus comprising:

a vacuum chamber having a chamber wall surrounding a vacuum processing space inside of the chamber, the chamber wall having an opening therein at one end of the chamber;

an IPVD source assembly situated in and forming a vacuum tight closure of the opening in the chamber wall;

a gas supply system connected to the chamber so as to supply a gas into the processing space;

a vacuum system connected to the chamber and operative to maintain gas in the processing space at a vacuum pressure level;

an RF energy source outside of the chamber;

the IPVD source assembly including:

a ring-shaped coating material source from which coating material is supplied to the processing space, the ring-shaped source having an open center and at least one surface in communication with the vacuum processing space, a window assembly including a dielectric window situated at the open center of the ring-shaped source and forming part of a vacuum tight enclosure with the chamber wall and having a chamber side and an outside, and a coil outside of the chamber at said one end of the chamber adjacent and on the outside of the dielectric window and connected to the RF energy source so as to inductively couple energy from the RF energy source, when energized thereby, through the window and into the processing space to sustain an inductively coupled plasma in the processing space that is sufficiently dense to ionize coating material from the ring-shaped source in the processing space;

a substrate support inside of the chamber opposite the processing space from the ring-shaped coating material source and having a wafer supporting surface thereon facing the processing space; and a replaceable metal chamber shield between the processing space and the wall of the chamber, the chamber shield including:

a generally cylindrical portion surrounding the processing space and supported on elongated supports at a plurality of points remote from exposure to heat from the processing space, and an annular end portion surrounding the substrate support and overlapping but not contacting the cylindrical portion to protect the wall of the chamber from coating material deposits in the vicinity thereof and to prevent sliding contact between said portions due to thermal expansion of one of the portions; and the IPVD source assembly including an annular dark space shield surrounding the ring-shaped coating material source and being spaced from and in close overlapping proximity to the cylindrical portion of the chamber shield so as to protect the wall of the chamber from coating material deposits in the vicinity thereof.

16. An ionized physical vapor deposition apparatus comprising:
   a vacuum chamber having a chamber wall surrounding a vacuum processing space inside of the chamber, the chamber wall having an opening therein at one end of the chamber;
   an IPVD source assembly situated in and forming a vacuum tight closure of the opening in the chamber wall;
   a gas supply system connected to the chamber so as to supply a gas into the processing space;
   a vacuum system connected to the chamber and operative to maintain gas in the processing space at a vacuum pressure level;
   an RF energy source outside of the chamber,
   the IPVD source assembly including:
      a ring-shaped coating material source from which coating material is supplied to the processing space, the ring-shaped source having an open center and at least one surface in communication with the vacuum processing space,
      a window assembly including a dielectric window situated at the open center of the ring-shaped source and forming part of a vacuum tight enclosure with the chamber wall and having a chamber side and an outside, and
      a coil outside of the chamber at said one end of the chamber adjacent and on the outside of the dielectric window and connected to the RF energy source so as to inductively couple energy from the RF energy source, when energized thereby, through the window and into the processing space to sustain an inductively coupled plasma in the processing space that is sufficiently dense to ionize coating material from the ring-shaped source in the processing space;
   a substrate support inside of the chamber opposite the processing space from the ring-shaped coating material source and having a wafer supporting surface thereon facing the processing space; and
   the gas and/or vacuum systems include a pressure controller configured to maintain vacuum pressure in the chamber sufficiently high so that ions in the plasma essentially thermalize in the processing space so that the distribution, energy and directionality thereof onto a wafer on the wafer supporting surface of the support are predominantly due to the electric field across a plasma sheath between the high-density plasma and the wafer.

17. The apparatus of claim 16 wherein the gas supply and pressure control system is operable to maintain the pressure within the vacuum chamber during deposition of the material at a pressure of at least 30 mTorr.

18. The apparatus of claim 16 wherein the gas supply and pressure control system is operable to maintain the pressure within the vacuum chamber during deposition of the material at a pressure between 30 mTorr and 130 mTorr.

19. An ionized physical vapor deposition apparatus comprising:
   a vacuum chamber having a chamber wall surrounding a vacuum processing space inside of the chamber, the chamber wall having an opening therein at one end of the chamber;
   an IPVD source assembly situated in and forming a vacuum tight closure of the opening in the chamber wall;
   a gas supply system connected to the chamber so as to supply a gas into the processing space;
   a vacuum system connected to the chamber and operative to maintain gas in the processing space at a vacuum pressure level;
   an RF energy source outside of the chamber;
   the IPVD source assembly including:
      a ring-shaped coating material source from which coating material is supplied to the processing space, the ring-shaped source having an open center and at least one surface in communication with the vacuum processing space,
      a window assembly including a dielectric window situated at the open center of the ring-shaped source and fanning part of a vacuum tight enclosure with the chamber wall and having a chamber side and an outside,
      a coil outside of the chamber at said one end of the chamber adjacent and on the outside of the dielectric window and connected to the RF energy source so as to inductively couple energy from the RF energy source, when energized thereby, through the window and into the processing space to sustain an inductively coupled plasma in the processing space that is sufficiently dense to ionize coating material from the ring-shaped source in the processing space, and
      a cup-shaped spacer of high dielectric material between the coil and the window, the coil being mounted within the high dielectric material, the material having a thickness of material in areas thereof near conductive surfaces that is thin but sufficient to suppress arcing to the conductive surfaces from the coil;
   a substrate support inside of the chamber opposite the processing space from the ring-shaped coating material source and having a wafer supporting surface thereon facing the processing space; and
   a shield between the window and the processing space configured to physically shield the inside of the window from the deposit thereon of electrically conductive coating material and maintaining effective inductive coupling of the RF energy from the coil into the processing space.

20. The apparatus of claim 19 wherein the spacer is formed of a plastic material such as TEFLON and substantially fills the space between the coil and the dielectric window.

21. An ionized physical vapor deposition apparatus comprising:
   a vacuum chamber having a chamber wall surrounding a vacuum processing space inside of the chamber, the chamber wall having an opening therein at one end of the chamber;
   an IPVD source assembly situated in and forming a vacuum tight closure of the opening in the chamber wall;
   a gas supply system connected to the chamber so as to supply a gas into the processing space;
   a vacuum system connected to the chamber and operative to maintain gas in the processing space at a vacuum pressure level;
   an RF energy source outside of the chamber;
   the IPVD source assembly including:

a ring-shaped coating material source from which coating material is supplied to the processing space, the ring-shaped source having an open center and at least one surface in communication with the vacuum processing space, a window assembly including a dielectric window situated at the open center of the ring-shaped source and forming part of a vacuum tight enclosure with the chamber wall and having a chamber side and an outside, a window shield inside of the chamber parallel and in close proximity to the dielectric window and configured to substantially shield the window from depositions of coating material and to permit substantial inductive coupling of the RF energy from the coil, through the window and shield and into the processing space, the window shield being formed of metal and having cooling fluid passages therethrough, the passages connecting to a cooling fluid source through the window and the open center of the coating material source; and a coil outside of the chamber at said one end of the chamber adjacent and on the outside of the dielectric window and connected to the RF energy source so as to inductively couple energy from the RF energy source, when energized thereby, through the window and into the processing space to sustain an inductively coupled plasma in the processing space that is sufficiently dense to ionize coating material from the ring-shaped source in the processing space; and a substrate support inside of the chamber opposite the processing space from the ring-shaped coating material source and having a wafer supporting surface thereon facing the processing space.

22. The apparatus of claim 21 wherein:

the window shield is an electrically conductive Faraday shield having the plurality of non-conductive features therein configured in relation to the coil so as to permit substantial inductive coupling of the RF energy from the coil, through the window and shield and into the processing space while preventing substantial capacitive coupling of RF energy from the coil into the chamber.

23. The apparatus of claim 21 wherein:

the window shield has a plurality of chevron-shaped slots therein configured in relation to the coil to permit substantial inductive coupling of RF energy from the coil, through the window and shield and into the chamber without providing a line-of-sight path through the slots for the motion of coating material from the chamber onto the window.

24. The apparatus of claim 21 wherein:

the window shield has a plurality of slots therein and is spaced from the window and has the slots dimensioned to facilitate the formation of plasma between the slots and the window that will clean material deposited at the slots onto the window.

25. The apparatus of claim 21 wherein:

the window shield is formed of cast metal and has cooling fluid passages integral thereto.

26. The apparatus of claim 21 wherein:

the coil is a three-dimensional RF coil configured such that magnetic field lines extending through turns thereof predominantly arch through the dielectric window and the processing space.

27. An ionized physical vapor deposition apparatus comprising:

a vacuum chamber having a chamber wall surrounding a vacuum processing space inside of the chamber, the chamber wall having an opening therein at one end of the chamber;

an IPVD source assembly situated in and forming a vacuum tight closure of the opening in the chamber wall;

a gas supply system connected to the chamber so as to supply a gas into the processing space;

a vacuum system connected to the chamber and operative to maintain gas in the processing space at a vacuum pressure level;

an RF energy source outside of the chamber;

the IPVD source assembly including:

a ring-shaped coating material source from which coating material is supplied to the processing space, the ring-shaped source having an open center and at least one surface in communication with the vacuum processing space, a window assembly including a dielectric window situated at the open center of the ring-shaped source and forming part of a vacuum tight enclosure with the chamber wall and having a chamber side and an outside, and a coil outside of the chamber at said one end of the chamber adjacent and on the outside of the dielectric window and connected to the RF energy source so as to inductively couple energy from the RF energy source, when energized thereby, through the window and into the processing space to sustain an inductively coupled plasma in the processing space that is sufficiently dense to ionize coating material from the ring-shaped source in the processing space;

a substrate support inside of the chamber opposite the processing space from the ring-shaped coating material source and having a wafer supporting surface thereon facing the processing space; and the substrate support includes an electrostatic chuck to hold a wafer substrate in the wafer support plane for processing, the electrostatic chuck including a bipolar rid and multiple zone system the bipolar grid.

28. The apparatus of claim 27 further comprising:

heating and cooling elements in the wafer support, back side gas conduction between the wafer support surface and a wafer supported thereon in the wafer support plane, a non-contact shadow ring overlying the peripheral edge of a substrate on the wafer support.

* * * * *

UNITED STATES PATENT AND TRADEMARK OFFICE
CERTIFICATE OF CORRECTION

PATENT NO.     : 6,719,886 B2
DATED          : April 13, 2004
INVENTOR(S)    : Drewery et al.

It is certified that error appears in the above-identified patent and that said Letters Patent is hereby corrected as shown below:

Title page,
Item [56], References Cited, OTHER PUBLICATIONS, reads "F. Cerio, et al., Film Properties of Ti/TiN Bilayers Deposited Sequentially by Ionized PHysical Vapor Deposition, J. Vac...." and should read -- F. Cerio, et al., Film Properties of Ti/TiN Bilayers Deposited Sequentially by Ionized Physical Vapor Deposition, J. Vac… --.

Drawings,
FIGURE 21, reads "HOT CATHODE GUAGE" and should read -- HOT CATHODE GAUGE --.

Column 4,
Line 7, reads "...target. RF energy of, for example, 13.56 MHZ, is applied to..." and should read -- ...target. RF energy of, for example, 13.56 MHz, is applied to… --.

Column 6,
Line 6, reads "FIG. 7 is cross-sectional view of the RF source assembly..." and should read -- FIG. 7 is a cross-sectional view of the RF source assembly… --.
Lines 24-25, read "FIG. 12 is an enlarged cross-sectional view of a DC con tact stub portion of the assembly of FIG. 9 of the IPVD..." and should read -- FIG. 12 is an enlarged cross-sectional view of a DC contact stub portion of the assembly of FIG. 9 of the IPVD… --.
Line 44, reads "...support assembly portion FIG. 16." and should read -- support assembly of portion FIG. 16. --.

Column 7,
Line 33, reads "...principle objectives of the IPVD source 503 include... and should read -- ...principal objectives of the IPVD source 503 include… --.

Column 11,
Line 14, reads "...Plasma, invented by Josef Breka, an inventor herein, hereby..." and should read -- ... Plasma, invented by Josef Brcka, an inventor herein, hereby… --.

Column 12,
Lines 46-47, read "...coupling, and they also apply pressure to the springs 77, These blocks are fitted at their upper end with contact fingers..." and should read -- ...coupling, and they also apply pressure to the springs 77. These blocks are fitted at their upper end with contact fingers… --.

UNITED STATES PATENT AND TRADEMARK OFFICE
CERTIFICATE OF CORRECTION

PATENT NO. : 6,719,886 B2
DATED : April 13, 2004
INVENTOR(S) : Drewery et al.

It is certified that error appears in the above-identified patent and that said Letters Patent is hereby corrected as shown below:

Column 13,
Lines 35-36, read "...of that O-ring. The source flange 67 interfaces electrically to the process chamber electrically, using a canted coil spring..." and should read -- ...of that O-ring. The source flange 67 interfaces to the process chamber electrically, using a canted coil spring... --.

Column 14,
Line 39, reads "...of electric fields near the wafer edge. The ring over laps but..." and should read -- ...of electric fields near the wafer edge. The ring overlaps but... --.

Column 15,
Line 49, reads "The turbo pump is backed by a non oil sealed type rotary..." and should read -- The turbo pump is backed by a nonoil sealed type rotary... --.

Column 17,
Lines 63-64, read "...a window assembly removably secured to the to either the housing or the coil assembly, the window assembly..." and should read -- ...a window assembly removably secured to either the housing or the coil assembly, the window assembly... --

Column 18,
Lines 43-45, read "...the electrically conductive shield connected to the dielectric window so as to be removable from the housing therewith." and should read -- ...the electrically conductive shield is connected to the dielectric window so as to be removable from the housing therewith. --.

Column 19,
Lines 2-3, read "...and by atmospheric pressure when a vacuum is affected within the chamber." and should read -- ...and by atmospheric pressure when a vacuum is effected within the chamber. --.

Column 21,
Line 10, Claim 15, should read:

15. An ionized physical vapor deposition apparatus comprising:
        a vacuum chamber having a chamber wall surrounding a vacuum processing space inside of the chamber, the chamber wall having an opening therein at one end of the chamber;
        an IPVD source assembly situated in and forming a vacuum tight closure of the opening in the chamber wall;
        a gas supply system connected to the chamber so as to supply a gas into the processing space;

UNITED STATES PATENT AND TRADEMARK OFFICE
CERTIFICATE OF CORRECTION

PATENT NO. : 6,719,886 B2
DATED : April 13, 2004
INVENTOR(S) : Drewery et al.

It is certified that error appears in the above-identified patent and that said Letters Patent is hereby corrected as shown below:

Column 21 (cont'd), a vacuum system connected to the chamber and operative to maintain gas in the processing space at a vacuum pressure level;
    a RF energy source outside of the chamber;
    the IPVD source assembly including:
        a ring-shaped coating material source from which coating material is supplied to the processing space, the ring-shaped source having an open center and at least one surface in communication with the vacuum processing space,
        a window assembly including a dielectric window situated at the open center of the ring-shaped source and forming part of a vacuum tight enclosure with the chamber wall and having a chamber side and an outside, and a coil outside of the chamber at said one end of the chamber adjacent and on the outside of the dielectric window and connected to the RF energy source so as to inductively couple energy from the RF energy source, when energized thereby, through the window and into the processing space to sustain an inductively coupled plasma in the processing space that is sufficiently dense to ionize coating material from the ring-shaped source in the processing space;
    a substrate support inside of the chamber opposite the processing space from the ring-shaped coating material source and having a wafer supporting surface thereon facing the processing space; and
    a replaceable metal chamber shield between the processing space and the wall of the chamber, the chamber shield including:
        a generally cylindrical portion surrounding the processing space and supported on elongated supports at a plurality of points remote from exposure to heat from the processing space, and
        an annular end portion surrounding the substrate support and overlapping but not contacting the cylindrical portion to protect the wall of the chamber from coating material deposits in the vicinity thereof and to prevent sliding contact between said portions due to thermal expansion of one of the portions; and
        the IPVD source assembly including an annular dark space shield surrounding the ring-shaped coating material source and being spaced from and in close overlapping proximity to the cylindrical portion of the chamber shield so as to protect the wall of the chamber from coating material deposits in the vicinity thereof.

UNITED STATES PATENT AND TRADEMARK OFFICE
CERTIFICATE OF CORRECTION

PATENT NO. : 6,719,886 B2
DATED : April 13, 2004
INVENTOR(S) : Drewery et al.

It is certified that error appears in the above-identified patent and that said Letters Patent is hereby corrected as shown below:

Column 21 (cont'd),
Line 5, Claim 16, should read

16. An ionized physical vapor deposition apparatus comprising:
    a vacuum chamber having a chamber wall surrounding a vacuum processing space inside of the chamber, the chamber wall having an opening therein at one end of the chamber;
    an IPVD source assembly situated in and forming a vacuum tight closure of the opening in the chamber wall;
    a gas supply system connected to the chamber so as to supply a gas into the processing space;
    a vacuum system connected to the chamber and operative to maintain gas in the processing space at a vacuum pressure level;
    a RF energy source outside of the chamber;
    the IPVD source assembly including:
        a ring-shaped coating material source from which coating material is supplied to the processing space, the ring-shaped source having an open center and at least one surface in communication with the vacuum processing space,
        a window assembly including a dielectric window situated at the open center of the ring-shaped source and forming part of a vacuum tight enclosure with the chamber wall and having a chamber side and an outside, and
        a coil outside of the chamber at said one end of the chamber adjacent and on the outside of the dielectric window and connected to the RF energy source so as to inductively couple energy from the RF energy source, when energized thereby, through the window and into the processing space to sustain an inductively coupled plasma in the processing space that is sufficiently dense to ionize coating material from the ring-shaped source in the processing space;
    a substrate support inside of the chamber opposite the processing space from the ring-shaped coating material source and having a wafer supporting surface thereon facing the processing space; and
    the gas and/or vacuum systems include a pressure controller configured to maintain vacuum pressure in the chamber sufficiently high so that ions in the plasma essentially thermalize in the processing space so that the distribution, energy and directionality thereof onto a wafer on the wafer supporting surface of the support are predominately due to the electric field across a plasma sheath between the high density plasma and the wafer.

UNITED STATES PATENT AND TRADEMARK OFFICE
CERTIFICATE OF CORRECTION

PATENT NO. : 6,719,886 B2
DATED : April 13, 2004
INVENTOR(S) : Drewery et al.

It is certified that error appears in the above-identified patent and that said Letters Patent is hereby corrected as shown below:

Column 22,
Line 18, reads "...source and fanning part of a vacuum tight enclosure..." and should read -- ...source and forming part of a vacuum tight enclosure...

Signed and Sealed this

Twenty-first Day of June, 2005

JON W. DUDAS
*Director of the United States Patent and Trademark Office*

UNITED STATES PATENT AND TRADEMARK OFFICE
CERTIFICATE OF CORRECTION

PATENT NO. : 6,719,886 B2
DATED : April 13, 2004
INVENTOR(S) : Drewery et al.

It is certified that error appears in the above-identified patent and that said Letters Patent is hereby corrected as shown below:

<u>Column 24,</u>
Lines 51-52, read "...processing, the electrostatic chuck including a bipolar rid and multiple zone system the bipolar grid." and should read -- ...processing, the electrostatic chuck including a bipolar grid and multiple zone wafer biasing system connected to the bipolar grid. --.

Signed and Sealed this

Thirteenth Day of June, 2006

JON W. DUDAS
*Director of the United States Patent and Trademark Office*